(12) United States Patent
Chung et al.

(10) Patent No.: US 8,648,424 B2
(45) Date of Patent: Feb. 11, 2014

(54) SEMICONDUCTOR DEVICE INCLUDING TRANSISTORS HAVING EMBEDDED SOURCE/DRAIN REGIONS EACH INCLUDING UPPER AND LOWER MAIN LAYERS COMPRISING GERMANIUM

(75) Inventors: Hoi-Sung Chung, Hwaseong-si (KR); Dong-Hyuk Kim, Seongma-si (KR); Myung-Sun Kim, Hwaseong-si (KR); Dong-Suk Shin, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/600,375

(22) Filed: Aug. 31, 2012

(65) Prior Publication Data
US 2013/0161751 A1 Jun. 27, 2013

(30) Foreign Application Priority Data

Dec. 26, 2011 (KR) ........................ 10-2011-0142390

(51) Int. Cl.
*H01L 21/70* (2006.01)
(52) U.S. Cl.
USPC ........................................................ 257/368

(58) Field of Classification Search
USPC .......................................................... 257/368
See application file for complete search history.

(56) References Cited

U.S. PATENT DOCUMENTS

| 7,759,199 B2 | 7/2010 | Thomas et al. |
| 7,800,154 B2 * | 9/2010 | Noguchi et al. ............. 257/315 |
| 2009/0108308 A1 * | 4/2009 | Yang et al. ..................... 257/288 |
| 2010/0301350 A1 * | 12/2010 | Tamura et al. ................... 257/77 |
| 2011/0062498 A1 | 3/2011 | Yang et al. |
| 2011/0250748 A1 * | 10/2011 | Fukuda et al. ................ 438/595 |

* cited by examiner

*Primary Examiner* — Anthony Ho
(74) *Attorney, Agent, or Firm* — Volentine & Whitt, PLLC

(57) ABSTRACT

A semiconductor device includes a substrate having a channel region, a gate insulation layer on the channel region, a gate electrode on the gate insulation layer, and source and drain regions in recesses in the substrate on both sides of the channel region, respectively. The source and drain regions include a lower main layer whose bottom surface is located at level above the bottom of a recess and lower than that of the bottom surface of the gate insulation layer, and a top surface no higher than the level of the bottom surface of the gate insulation layer, and an upper main layer contacting the lower main layer and whose top surface extends to a level higher than that of the bottom surface of the gate insulation layer, and in which the lower layer has a Ge content higher than that of the upper layer.

20 Claims, 25 Drawing Sheets

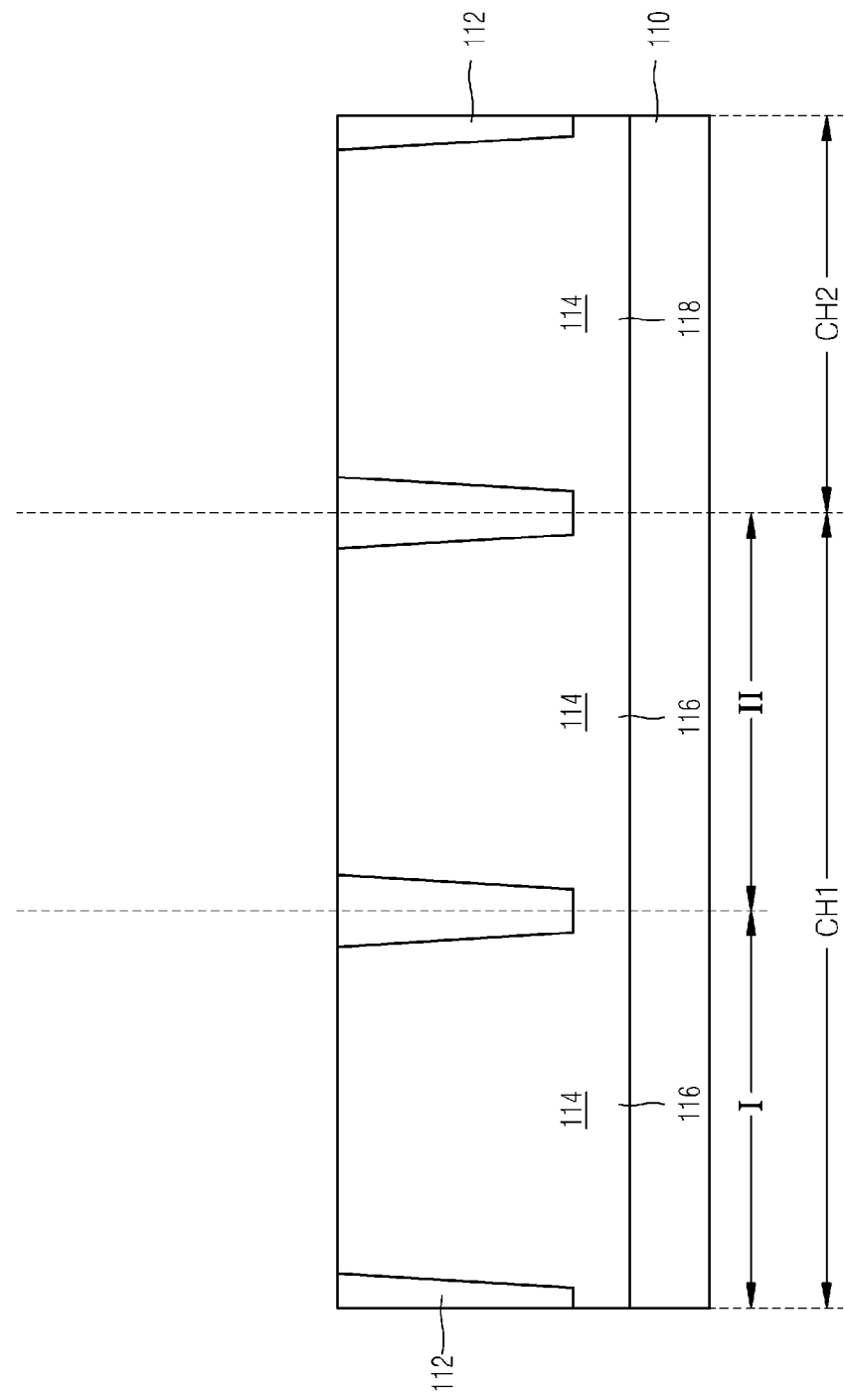

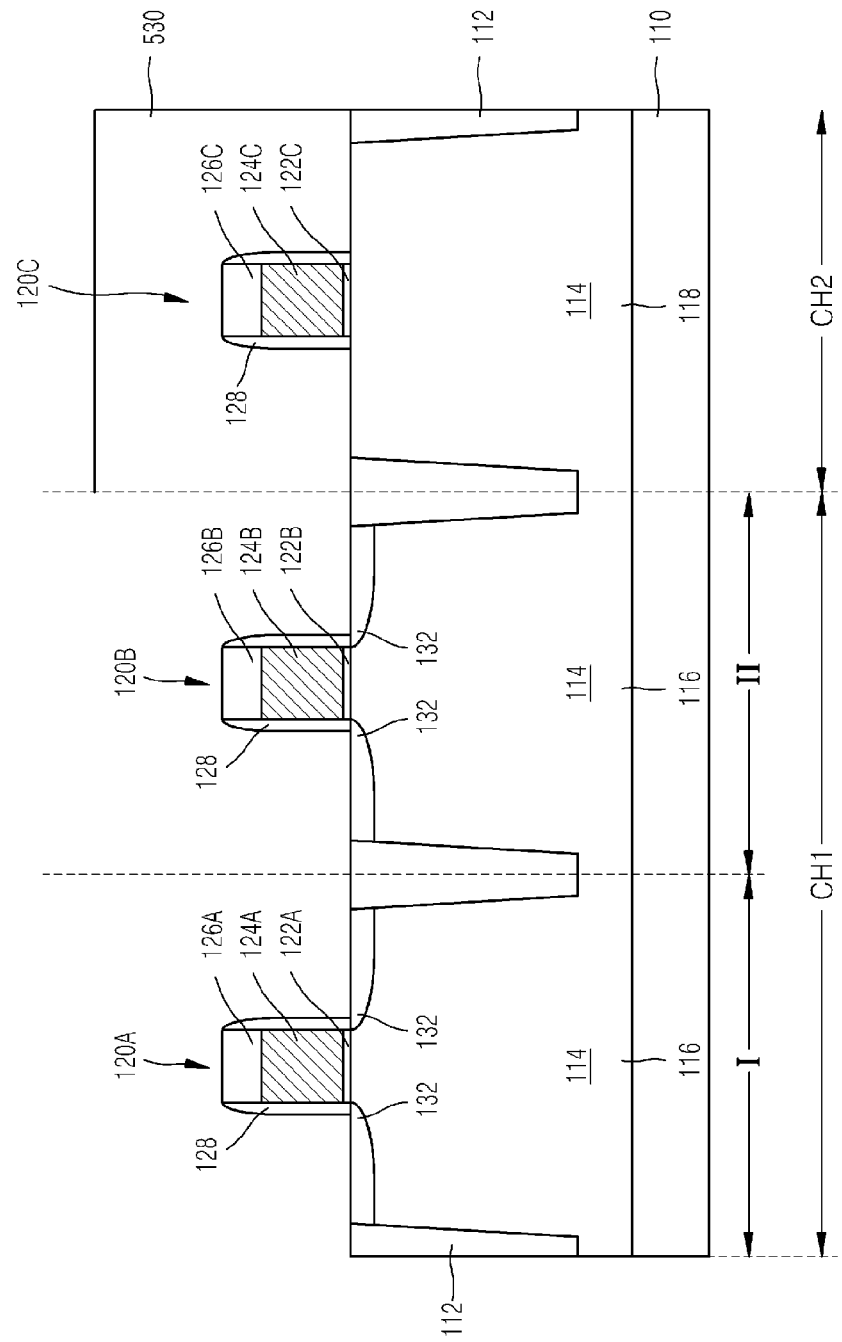

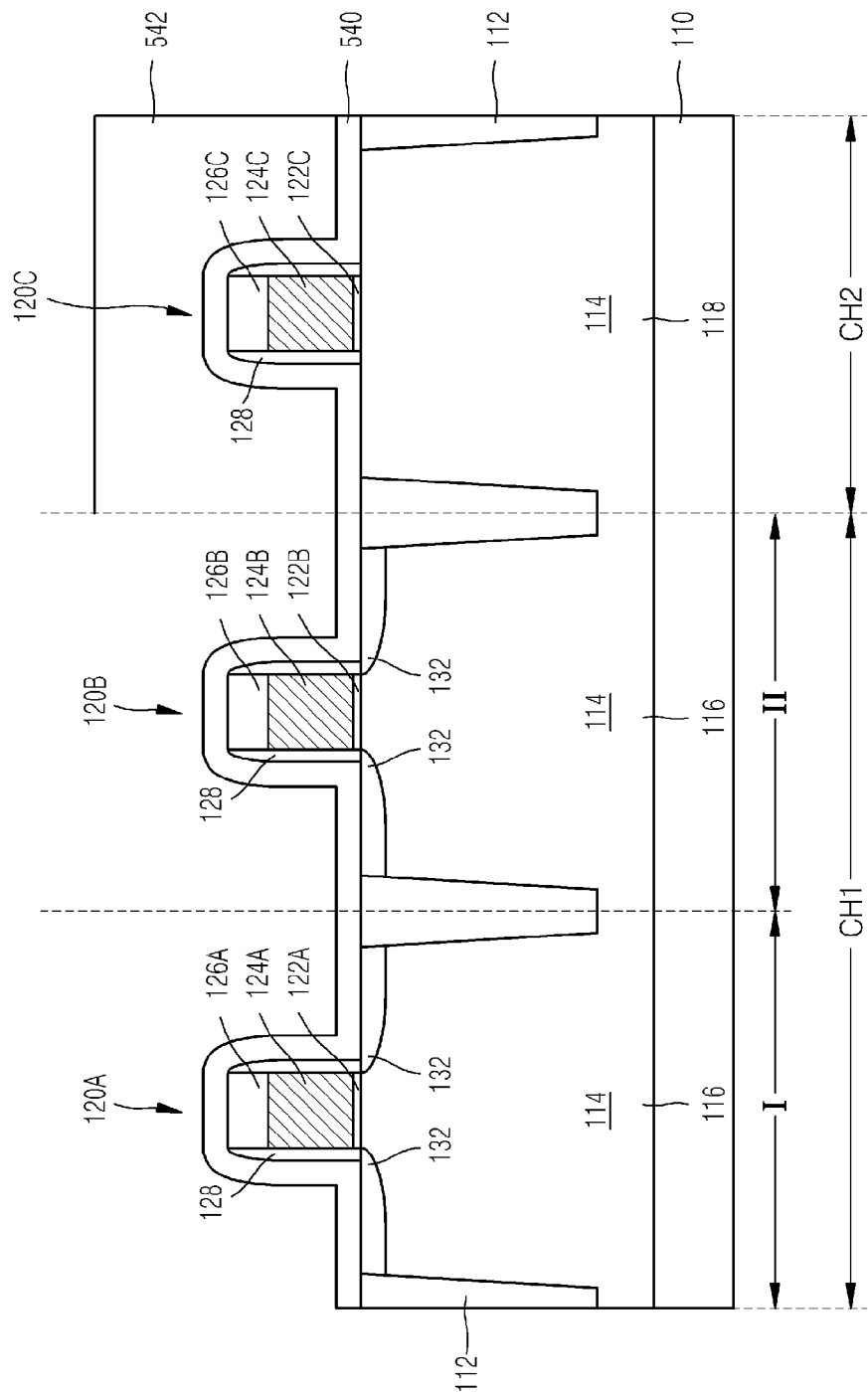

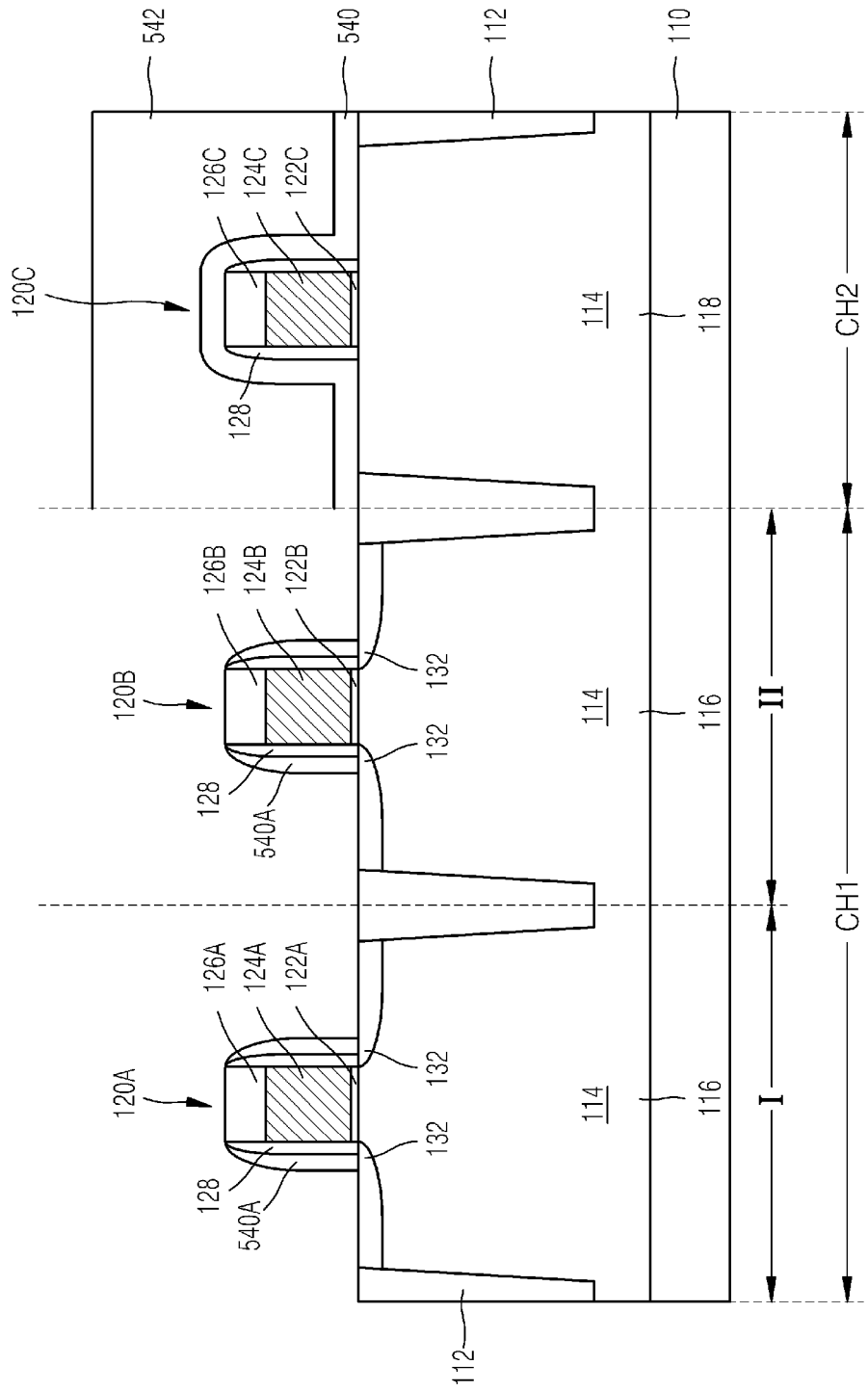

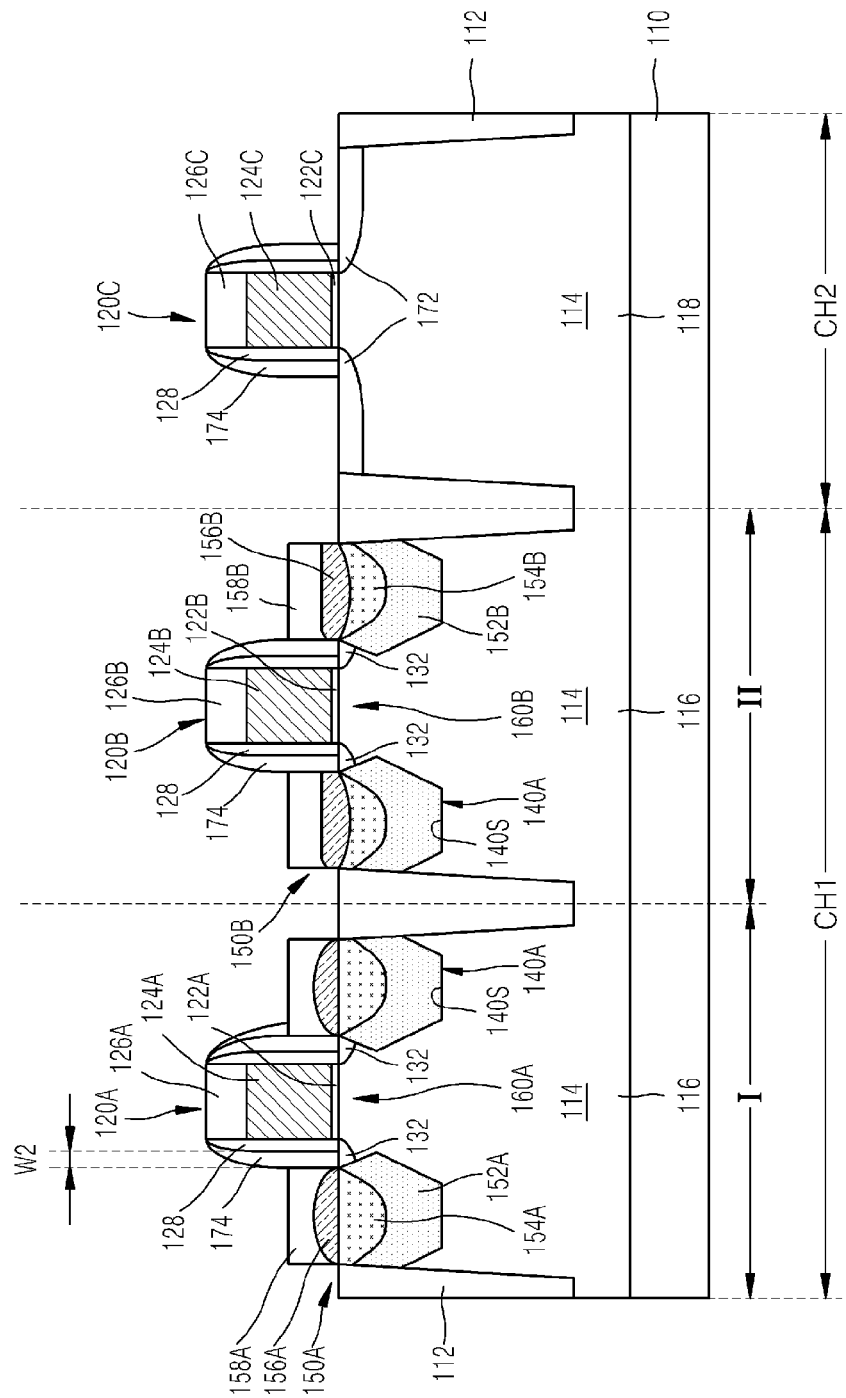

SEMICONDUCTOR DEVICE INCLUDING TRANSISTORS HAVING EMBEDDED SOURCE/DRAIN REGIONS EACH INCLUDING UPPER AND LOWER MAIN LAYERS COMPRISING GERMANIUM

PRIORITY STATEMENT

This application claims the benefit of Korean Patent Application No. 10-2011-0142390, filed on Dec. 26, 2011, in the Korean Intellectual Property Office, the disclosure of which is hereby incorporated by reference in its entirety.

BACKGROUND

The inventive concept relates to semiconductor devices. More particularly, the inventive concept relates to semiconductor devices including a transistor with embedded source and drain regions.

Various techniques have been developed for fabricating metal oxide semiconductor field effect transistors (MOSFET) that operate at high speeds and at a low voltage. For example, a technique of forming embedded source and drain regions has been proposed to improve the carrier mobility in a channel of a transistor.

SUMMARY

According to an aspect of the inventive concept, there is provided a semiconductor device comprising a substrate having a channel region, and a pair of recesses therein on both sides of the channel region, a gate insulation layer on the channel region, a gate electrode on the gate insulation layer, and a source and a drain on surfaces delimiting bottoms of the recesses, respectively, and in which at least one of the source and drains includes lower and upper main layers of material having different atomic percentages of Ge. The lower main layer has a bottommost point disposed at a level in the device higher than that of the bottoms of the recesses and lower than that of the bottom surface of the gate insulation layer, and a top surface no portion of which is disposed above the level of the bottom surface of the gate insulation layer. The upper main layer contacts the lower main layer, and has a topmost point disposed at a level in the device higher than that of the bottom surface of the gate insulation layer. The Ge content in terms of atomic % of the lower main layer is greater than that of the upper main layer.

According to another aspect of the inventive concept, there is provided a semiconductor device comprising a substrate having a plurality of recesses therein in each of a first device region and a second device region of the device, a first transistor in the first device region and comprising a first gate insulation layer, a first gate electrode, and first source and drain regions, and a second transistor in the second device region and comprising a second gate insulation layer, a second gate electrode, and second source and drain regions, and in which the source and drain regions each have lower and upper main layers of material having different atomic percentages of Ge.

In this respect, the first source and drain regions comprise a first lower main layer of material comprising Ge and having a bottommost point disposed at a level in the device higher than the bottoms of the recesses in the first device region and lower than that of the bottom surface of the first gate insulation layer, and a top surface no portion of which is disposed above the level of the bottom surface of the gate insulation layer, and a first upper main layer disposed on the first lower main layer, and having a topmost point disposed at a level in the device higher than that of the bottom surface of the gate insulation layer, the Ge content in terms of atomic % of the first lower main layer being greater than that of the first upper main layer.

The second source and drain regions comprise a second lower main layer of material comprising Ge and having a bottommost point disposed at a level in the device higher than the bottoms of the recesses in the second device region and lower than that of the bottom surface of the second gate insulation layer, and a top surface at least a portion of which is disposed below the level of the bottom surface of the second gate insulation layer, and a second upper main layer disposed on the second first lower main layer, and having a topmost point disposed at a level in the device higher than that of the bottom surface of the second gate insulation layer, and the Ge content in terms of atomic % of the second lower main layer being greater than that of the second upper main layer.

According to still another aspect of the inventive concept, there is provided a semiconductor device comprising a substrate having a plurality of recesses in a first device region and a plurality of recesses in a second device region, whereby the recesses have openings at an upper surface of the substrate, and wherein the layout of the openings in the first device region is different from the layout of the openings in the second device region, a first transistor in the first device region and a second transistor in the second device region, the transistors being constituted by an insulating layer providing gate insulation layer of the transistors, a conductive layer providing gate electrode of the transistors, and embedded source and drain regions occupying the recesses, and in which the embedded source and drain regions of the first and second transistors are each of material comprising Ge, and the Ge content of the material in terms of atomic % decreases in a direction from a first point disposed at a level in the device lower than that of the bottom surface of the insulating layer to a topmost point disposed at a level in the device higher than that of the bottom surface of the insulating layer.

BRIEF DESCRIPTION OF THE DRAWINGS

The inventive concept will be more clearly understood from the following detailed description of preferred embodiments made in conjunction with the accompanying drawings in which.

DETAILED DESCRIPTION OF THE EMBODIMENTS

Figure 1:
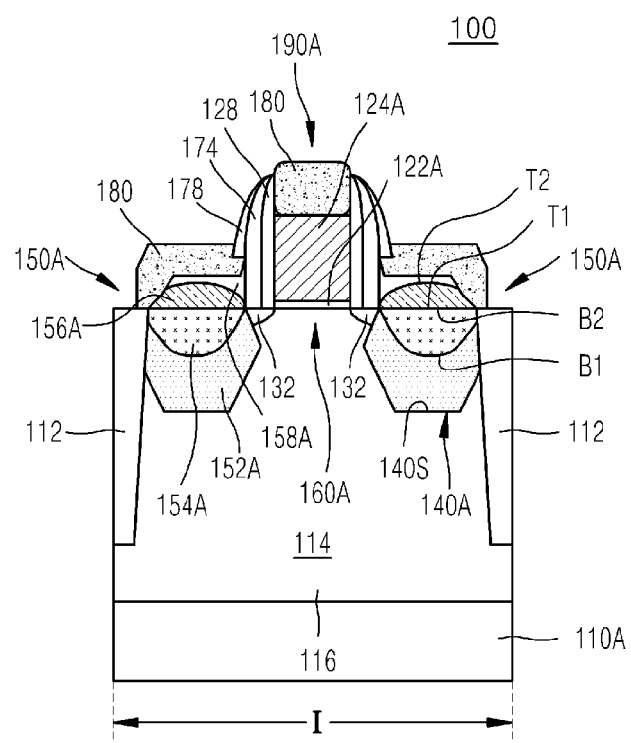
FIG. 1 is a cross-sectional view of one type of transistor of a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," "lower", "top" and "bottom" as well as the term "level" are used to describe an element's and/or feature's relationship to another element(s) and/or feature(s) as illustrated in the figures, wherein the substrate is oriented horizontally. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "top" or "bottom" as used to describe a surface generally refer not only to the orientation depicted in the drawings but to the fact that the surface is the uppermost or bottommost surface or contains the uppermost or bottommost points of the element being described in the orientation depicted, as would be clear from the drawings and context of the written description.

It will also be understood that when an element or layer is referred to as being "on" another element or layer, it can be directly on the other element or layer or intervening elements or layers may be present. In contrast, when an element or layer is referred to as being "directly on" or "contacting" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. It will also be clear that the phrase "extends to a level" when used to describe a surface refers to the fact that the surface has at least one point or portion located at the particular level.

An embodiment of or portion of a semiconductor device, comprising a transistor, according to the inventive concept will now be described with reference to FIG. 1. In the description that follows, the term "first" may be used for descriptive purposes only and not to imply that the device necessarily has more than one of the elements/features being described.

The semiconductor device 100 includes a substrate 110A on which a component is formed. The substrate 110A may be a silicon substrate. The component may be a system large scale integration (LSI), a logic circuit, an image sensor such as a CMOS image sensor (CIS), a memory device such as a flash memory, a DRAM, an SRAM, an EEPROM, a PRAM, an MRAM, or an RRAM, or a micro-electro-mechanical system (MEMS).

The substrate 110A has a first well 116 therein. In one example of this embodiment, the first well 116 is an N type well, and the first transistor 190A is a PMOS transistor.

An active region 114 is defined in (the well of) the substrate 110A by an isolation layer 112, and the first transistor 190A is located at the top of the active region 114. The first transistor 190A has a gate structure including a first gate insulation layer 122A, a first gate layer 124A, and a metal silicide layer 180 (optional) stacked one atop the other in the foregoing sequence. Both sidewalls of the gate structure are covered with a plurality of spacers 128, 174, and 178. The spacers 128, 174, and 178 may be silicon oxide layers.

The first transistor 190A also has a pair of source and drain extensions 132 formed on both sides of the gate structure in the substrate 110A. Two recesses 140A are formed in the substrate 110A adjacent to the source and drain extensions 132, respectively. Each of the two recesses 140A is delimited by a recess bottom surface 140S. Each of the recesses 140A may also have a polygonal cross section. First source and drain regions 150A occupy the recesses 140A, respectively. A first channel region 160A is provided between the first source and drain regions 150A in a portion of the active region 114 closest to the first gate insulation layer 122A.

The first source and drain regions 150A have an embedded SiGe structure including a plurality of epitaxially grown SiGe layers. In particular, each of the first source and drain regions 150A includes a first buffer semiconductor layer 152A, a first lower main semiconductor layer 154A, a first upper main semiconductor layer 156A, and a first capping semiconductor layer 158A disposed one atop the other in the foregoing sequence on the recess bottom surface 140S.

The first lower main semiconductor layer 154A may have a Ge content of about 30 to 50 atomic %. Furthermore, the first lower main semiconductor layer 154A has a bottom surface B1 spaced above the recess bottom surface 140S and which extends at a level beneath that of a bottom surface of the first gate insulation layer 122A, and a top surface T1 disposed at a level that is not lower than that of the bottom surface of the first gate insulation layer 122A. In one example of this embodiment, the bottom surface B1 of the first lower main semiconductor layer 154A extends to a level lower than that of the first channel region 160A. Also, in an example of this embodiment, the first lower main semiconductor layer 154A has a top surface T1 disposed at the same level as the bottom surface of the first gate insulation layer 122A.

The first upper main semiconductor layer 156A may have a Ge content greater than 0, less than or equal to about 35 atomic %, and smaller than the Ge content in terms of atomic % of the first lower main semiconductor layer 154A. Preferably, the first upper main semiconductor layer 156A is an SiGe layer having a Ge content of about 25 to about 35 atomic %. Furthermore, the first upper main semiconductor layer 156A has a bottom surface B2 in contact with the first lower main semiconductor layer 154A, and a top surface T2 extending to a level higher than that of the bottom surface of the first gate insulation layer 122A.

The first buffer semiconductor layer 152A is an SiGe layer having a Ge content (atomic %) smaller than that of the first lower main semiconductor layer 154A. In examples of this embodiments, the Ge content of the first lower main semiconductor layer 154A is between about 30 to about 50 atomic %, and the first buffer semiconductor layer 152A has a Ge content of about 10 to about 25 atomic %. In any case, the first buffer semiconductor layer 152A is interposed between the recess bottom surface 140S and the first lower main semiconductor layer 154A. The first buffer semiconductor layer 152A provides a buffer between the crystal lattices, of sharply different sizes, of the respective materials used to form the substrate 110A and the first lower main semiconductor layer 154A, to prevent defects such as dislocations from occurring.

The first capping semiconductor layer 158A has a Ge content smaller (atomic %) than that of the first upper main semiconductor layer 156A. Preferably, the first capping semiconductor layer 158A has a Ge content of about 0 to about 10 atomic %. The first capping semiconductor layer 158A protects the first upper main semiconductor layer 156A and the first lower main semiconductor layer 154A from being damaged during wet processes, for example, wet cleaning or wet etching, that may be performed after the layers 154A and 156A are formed.

The first buffer semiconductor layer 152A, the first lower main semiconductor layer 154A, the first upper main semiconductor layer 156A, and the first capping semiconductor layer 158A in each of the first source and drain regions 150A are doped with impurities. For example, the impurities are boron (B) ions.

The metal silicide layer 180 in the illustrated example of this embodiment covers the first capping semiconductor layer 158A on each of the first source and drain regions 150A. However, as mentioned above, the metal silicide layer 180 is optional.

Figure 2:
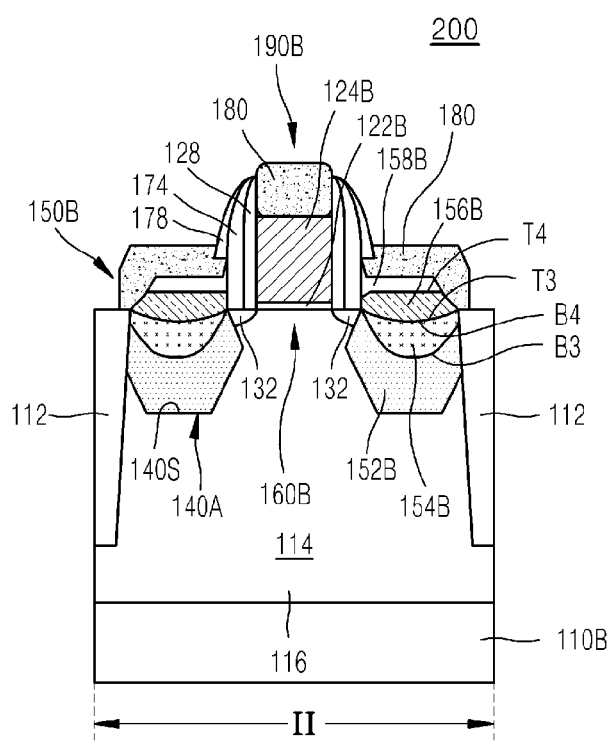
FIG. 2 is a cross-sectional view another type of transistor of a semiconductor device according to the inventive concept.

Another embodiment of or portion of a semiconductor device, comprising a transistor, according to the inventive concept will be described with reference to FIG. 2. In the description that follows, the term "second" may be used merely for descriptive purposes and not to imply that the device necessarily has two of the elements/features being described. More specifically, as will be clear later on, the terms first and second as used in connection with the description of the embodiments of FIGS. 1 and 2 are at times used only to distinguish like elements of the embodiments from one another.

The semiconductor device 200 includes a substrate 110B on which a component is formed. The substrate 110B may have a structure similar to that of the substrate 110A of FIG. 1 and the component may be one of those from the list provided in the description of FIG. 1.

A second transistor 190B is formed on an active region 114 of the substrate 110B. The second transistor 190B has a gate structure including a second gate insulation layer 122B, a second gate layer 124B, and a metal silicide layer 180 (optional) disposed one atop the other in the foregoing sequence. Both sidewalls of the gate structure are covered with a plurality of spacers 128, 174, and 178.

The second transistor 190B also has a pair of second source and drain extensions 132 formed on both sides of the gate structure in the substrate 110B, and two second source and drain regions 150B occupying recesses 140A, respectively, in the substrate 110B. Thus, the source and drain regions 150B are situated on recess bottom surfaces 140S delimiting the bottoms of the recesses 140A, respectively. A second channel region 160B is provided between the second source and drain regions 150B in a portion of the active region 114 closest to the second gate insulation layer 122B.

The second source and drain regions 150B have an embedded SiGe structure including a plurality of epitaxially grown SiGe layers. In particular, each of the first source and drain regions 150B includes a second buffer semiconductor layer 152B, a second lower main semiconductor layer 154B, a second upper main semiconductor layer 156B, and a second capping semiconductor layer 158B disposed one atop the other on the recess bottom surfaces 140S in the foregoing sequence.

The second lower main semiconductor layer 154B has a bottom surface B3 spaced above the recess bottom surface 140S and extending to a level beneath that of the bottom surface of the second gate insulation layer 122B, and a top surface T3 extending to a level beneath that of the bottom surface of the second gate insulation layer 122B.

Preferably, the second lower main semiconductor layer 154B has a Ge content of about 30 to about 50 atomic %. Furthermore, in an example of this embodiment, the bottom surface B3 of the second lower main semiconductor layer 154B extends to a level lower than that of the second channel region 160B.

The Ge content (atomic %) of the second upper main semiconductor layer 156B is greater than 0 and smaller than the Ge content (atomic %) of the second lower main semiconductor layer 154B. Preferably, the second upper main semiconductor layer 156B has a Ge content greater than 0 and less than or equal to about 35 atomic %. In an example of this embodiment, the second upper main semiconductor layer 156B is an SiGe layer having a Ge content of about 25 to about 35 atomic %. Furthermore, the second upper main semiconductor layer 156B has a bottom surface B4 in contact with the second lower main semiconductor layer 154B, and a top surface T4 disposed at a level higher than that of the bottom surface of the second gate insulation layer 122B.

The second buffer semiconductor layer 152B is an SiGe layer having a Ge content (atomic %) smaller than that of the second lower main semiconductor layer 154B. In examples of this embodiment, the second buffer semiconductor layer 152B has a Ge content between about 10 to about 25 atomic %, and the Ge content of the second lower main semiconductor layer 154B is in a range of about 30 to about 50 atomic %. Furthermore, the second buffer semiconductor layer 152B is interposed between the recess bottom surface 140S and the second lower main semiconductor layer 154B. The second buffer semiconductor layer 152B provides a buffer between the crystal lattices, of sharply different sizes, of the respective materials used to form the substrate 110B and the second lower main semiconductor layer 154B, to prevent defects such as dislocations from occurring.

The second capping semiconductor layer 158B has a Ge content smaller than that of the second upper main semiconductor layer 156B. Preferably, the second capping semiconductor layer 158B has a Ge content of about 0 to about 10 atomic %. The second capping semiconductor layer 158B protects the second upper main semiconductor layer 156B and the second lower main semiconductor layer 154B from being damaged during a wet process, for example, wet cleaning or wet etching, that may be performed during the fabrication of the device after the layers 154B and 156B are formed.

The second buffer semiconductor layer 152B, the second lower main semiconductor layer 154B, the second upper main semiconductor layer 156B, and the second capping semiconductor layer 158B in each of the second source and drain regions 150B are each doped with impurities. The impurities may be boron (B) ions.

The metal silicide layer 180 covers the second capping semiconductor layer 158B on the second source and drain regions 150B. However, as mentioned above, the metal silicide layer 180 is optional.

An embodiment of a semiconductor device according to the inventive concept will now be described with reference to FIG. 3.

Figure 3:
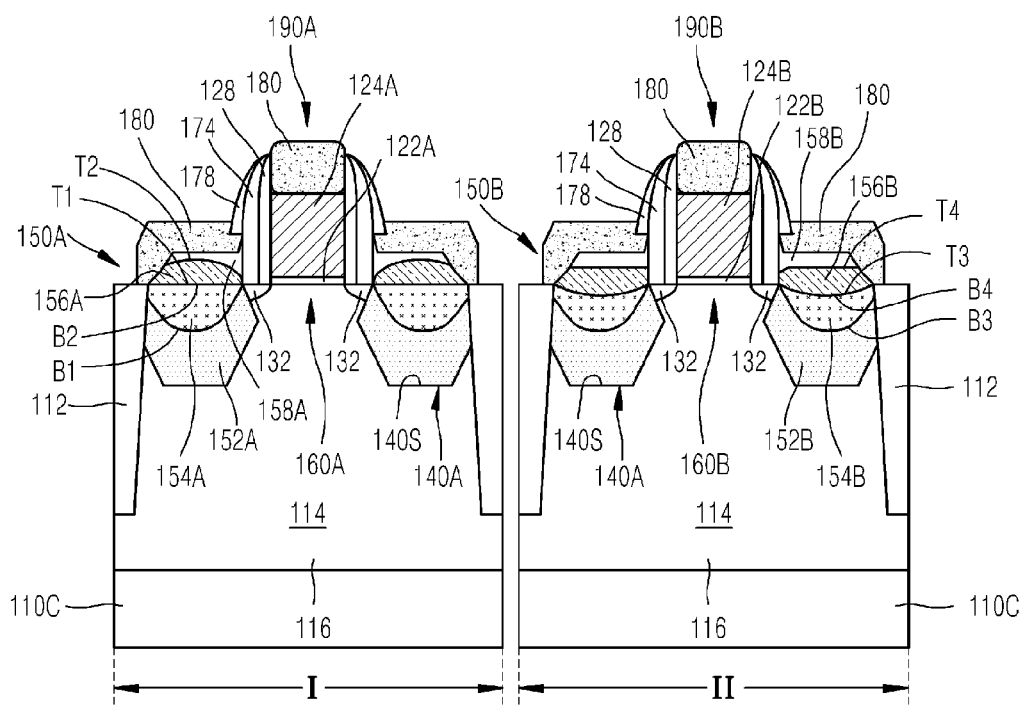
FIG. 3 is a cross-sectional view of an embodiment of a semiconductor device, having both types of transistors shown in FIGS. 1 and 2, according to the inventive concept.

Referring to FIG. 3, the semiconductor device 300 has a first device region I and a second device region II, and includes a substrate 110C.

Transistors 190A, 190B are provided in the first and second device regions I and II of the device 300 at a plurality of active regions 114 each defined by an isolation layer 112. The transistors 190A, 190B have channels of a first conductivity type, whereas the active regions 114 of the substrate 110C are provided in first wells 116 of a second conductivity type, i.e., conductivity opposite to that of the channels, formed by injecting impurities into a body of the substrate 110C. As one example of this embodiment, a plurality of PMOS transistors are provided in each of the first and second device regions I and II of the device, and the first wells 116 are N type wells.

As is clear from the FIG. 3, the transistors 190A provided in the first device region I each have the same structure as that shown in and described above with reference to FIG. 1, and the transistors 190B provided in the second device region II each have the same structure as that shown in and described above with reference to FIG. 2. Therefore, reference may be had to the descriptions of FIGS. 1 and 2 for the structural features/characteristics of the transistors provided in the first device region I and the transistors provided in the second device region II.

The first device region I and the second device region II can also be distinguished from each other in terms of the layouts of the recesses 140A in the substrate in the regions, respectively. More specifically, these differences can be attributed to a difference in the numbers of transistors in the regions, respectively, in the total areas occupied by the source/drain regions of the transistors in the regions, respectively, in the size of the footprints (areas) occupied by the transistors in the regions, respectively, and/or in the densities at which the transistors are arranged in the regions, respectively.

More specifically, for example, the ratio of the sum of the areas occupied by all source and drain regions in the first device region I to the total area of the first device region I (namely, a first area proportion) may be different from the ratio of the sum of the areas occupied by all source and drain regions in the second device region II to the total area of the second device region II (a second area proportion). For example, the area proportion of the first device region I may be less than the area proportion of the second device region II.

Likewise, the number of transistors per unit area in the first device region I (first transistor density) may be different from the number of transistors per unit area in the second device region II (second transistor density). For example, the first transistor density may be less than the second transistor density.

In addition, the transistors 190A, 190B in the first device region I and the second device region II have the same type of channel. For example, PMOS transistors are provided in both the first device region I and the second device region II. Also, the first device region I and the second device region II may border each other or may be spaced apart from each other by a predetermined distance. The first device region I and the second device region II may be located in different dies of a wafer constituting the substrate 110C. Alternatively, the first device region I and the second device region II may be located in the same die of a wafer constituting the substrate 110C.

Still further, the same function may be performed by the device 300 in both the first device region I and the second device region II. However, the third embodiment is not so limited. That is, different functions may be performed by the device in the first device region I and the second device region II. In either case, each of the first device region I and the second device region II may be constituted by a respective component selected from the group consisting of a system LSI, a logic circuit, an image sensor such as a CIS, a memory device such as a flash memory, a DRAM, an SRAM, an EEPROM, a PRAM, an MRAM, or an RRAM, and an MEMS.

Figure 4:
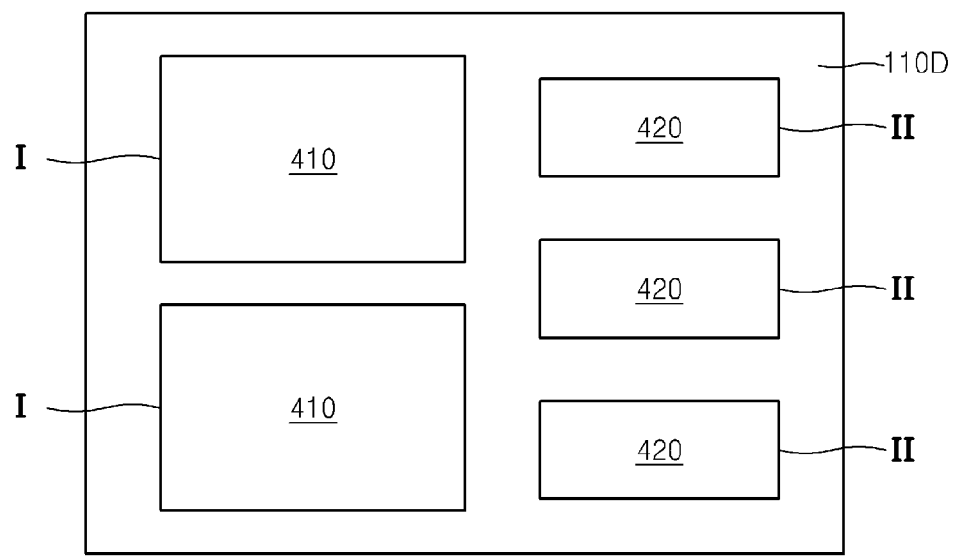
FIG. 4 is a block diagram of a layout of an embodiment of a semiconductor device according to the inventive concept.

FIG. 4 shows in plan an embodiment a semiconductor device 400 according to of the inventive concept.

The semiconductor device 400 comprises a substrate 110D and has a plurality of first device regions I and a plurality of second device regions II. In the example shown in FIG. 4, the semiconductor device 400 has two first device regions I and three second device regions II. However, the inventive concept is not so limited thereto, as various numbers of first device regions I and second device regions II may be provided. First components 410 occupy the first device regions I, respectively, and second components 420 having functions different than those of the first components 420 occupy the second device regions II, respectively. As was mentioned above with reference to FIG. 3, each of the first and second components 410 and 420 may be selected from the group consisting of a system LSI, a logic circuit, an image sensor such as a CIS, a memory device such as a flash memory, a DRAM, an SRAM, an EEPROM, a PRAM, an MRAM, or an RRAM, and an MEMS. In addition, FIG. 4 schematically shows, by virtue of the different areas of the device regions I and II, that the layout of recesses in the substrate in each first device region I may be different than that of the recesses in the substrate in each second device region II. These differences may be attributed to any of the characteristic differences described with reference to FIG. 3 above, e.g., by virtue of the first and second device regions I and II having different integration densities.

The first components 410 and the second components 420 are each formed by at least one of the semiconductor devices 100 and 200, respectively, shown in and described with reference to FIGS. 1 and 2.

A method of fabricating a semiconductor device according to the inventive concept will now be described with reference to FIGS. 5A-5T.

Referring first to FIG. 5A, an isolation layer 112 is formed in a substrate 110 having a first channel type transistor region CH1 and a second channel type transistor region CH2, thereby defining active regions 114.

The substrate 110 may be a semiconductor substrate such as a silicon substrate. More specifically, the substrate 110 may be a wafer such as a silicon wafer, and the first channel type transistor region CH1 and the second channel type transistor region CH2 may be located in different dies on the same substrate 110 or in the same die on the same substrate 110 so as to either be spaced apart from each other or so as to border each other. The first and second regions I and II may also be distinguished from each other in any of the ways described above with reference to FIG. 3, e.g., in terms of their area proportions and/or integration densities.

The isolation layer 112 may be formed of an oxide, a nitride, or a combination thereof.

Components (examples of which have been given previously) are formed at the active regions 114. The components formed at the active regions of the first channel type transistor region CH1 and the second channel type transistor region CH2 may provide the same or different functions in the device 500 that is ultimately produced (FIG. 5T).

More specifically, a plurality of first wells 116 are formed by injecting ions of a second conductivity type (impurities) into portions the active regions 114 of the first channel type transistor region CH1 of the substrate 100. A second well 118 is formed by injecting ions (impurities) of a first conductivity type into the active region 114 of the second channel type transistor region CH2 of the substrate 100. In one example of this embodiment, the first channel type transistor region CH1 is a PMOS transistor region, and the first wells 116 are N type wells, whereas the second channel type transistor region CH2 is an NMOS transistor region, and the second well 118 is a P type well.

Figure 5B:
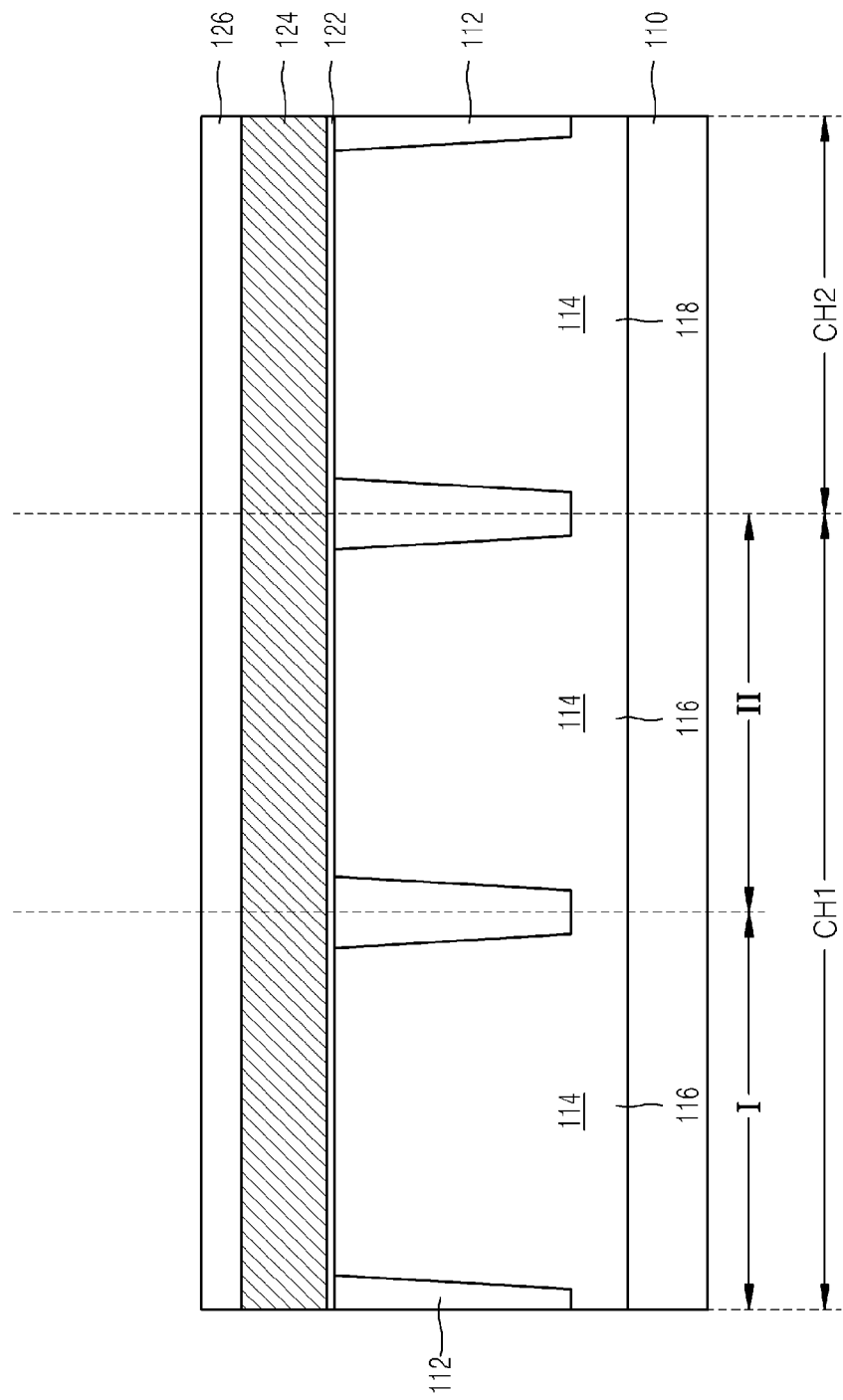
FIGS. 5A through 5T are cross-sectional views illustrating a method of fabricating semiconductor devices according to the inventive concept.

Referring to FIG. 5B, an insulation layer 122, a conductive layer 124, and a capping layer 126 are sequentially formed on the substrate 110.

The insulation layer 122 may be formed by chemical vapor deposition (CVD), atomic layer deposition (ALD), or thermal oxidization. The insulation layer 122 may be formed of an oxide or a metal oxide. More specifically, the insulation layer 122 may comprises at least one of silicon oxide, silicon oxynitride, hafnium oxide, zirconium oxide, aluminum oxide, and tantalum oxide.

The conductive layer 124 may be formed by CVD, ALD, or sputtering. This respect, the conductive layer 124 may be formed of conductive silicon, metal, a metal silicide, a conductive metal nitride, a conductive metal oxide, or an alloy. For example, the conductive layer 124 may be formed of at least one of impurity-doped polysilicon, tungsten (W), tungsten nitride, a tungsten silicide, aluminum (Al), aluminum nitride, tantalum (Ta), tantalum nitride, a tantalum silicide, titanium (Ti), titanium nitride, a cobalt silicide, molybdenum (Mo), ruthenium (Ru), nickel (Ni), NiSi, or a combination of these materials.

The capping layer 126 may be formed of a silicon nitride.

Figure 5C:
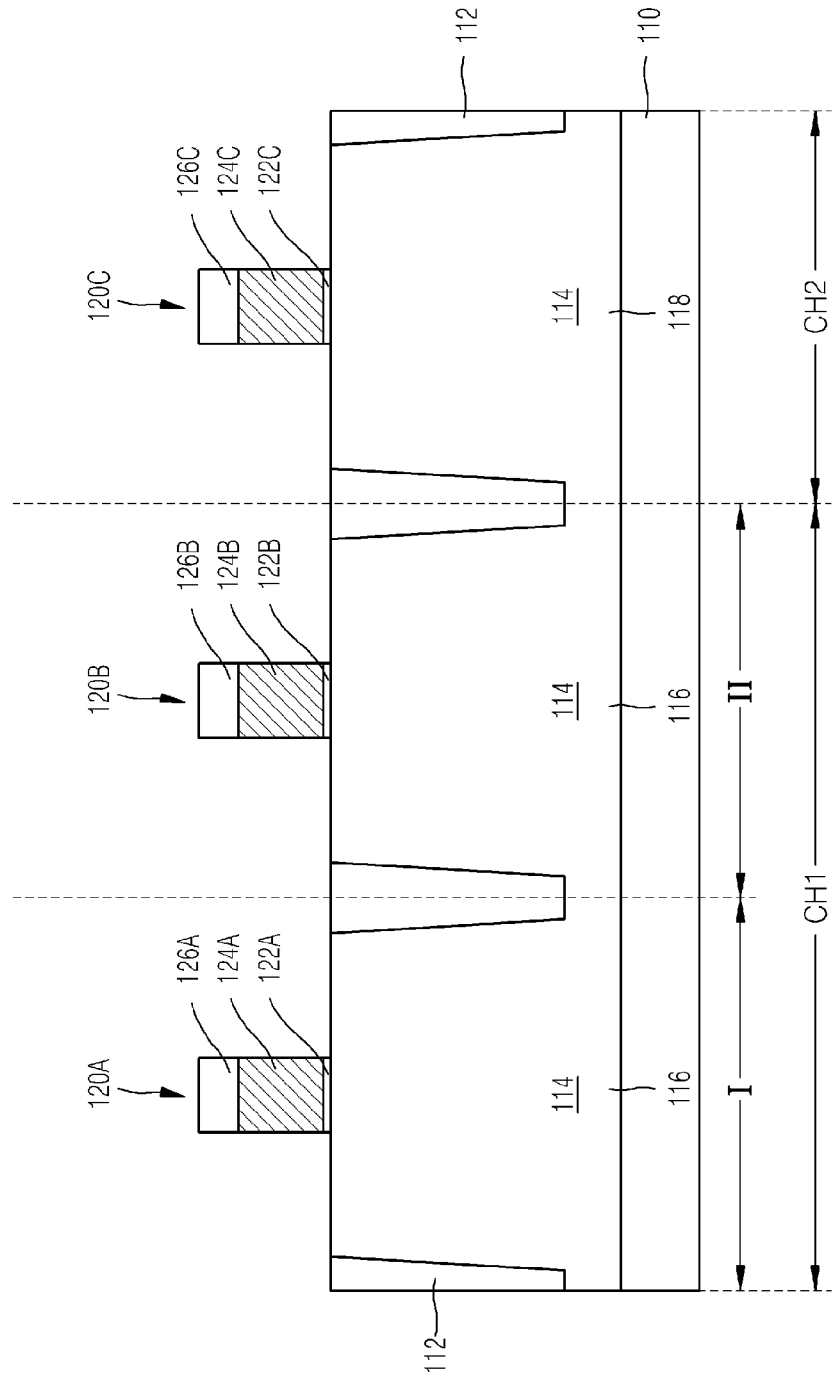

Referring to FIG. 5C, the capping layer 126, the conductive layer 124, and the insulation layer 122 are sequentially patterned to form first, second, and third gate structures 120A, 120B, and 120C in the first and second device regions I and II and the second channel type transistor region CH2, respectively. Thus, the first gate structure 120A includes a first gate insulation layer 122A, a first gate layer 124A, and a first capping layer pattern 126A located in the first device region I. The second gate structure 120B includes a second gate insulation layer 122B, a second gate layer 124B, and a second capping layer pattern 126B located in the second device region II. The third gate structure 120C includes a third gate insulation layer 122C, a third gate layer 124C, and a third capping layer pattern 126C located in the second channel type transistor region CH2.

Figure 5D:
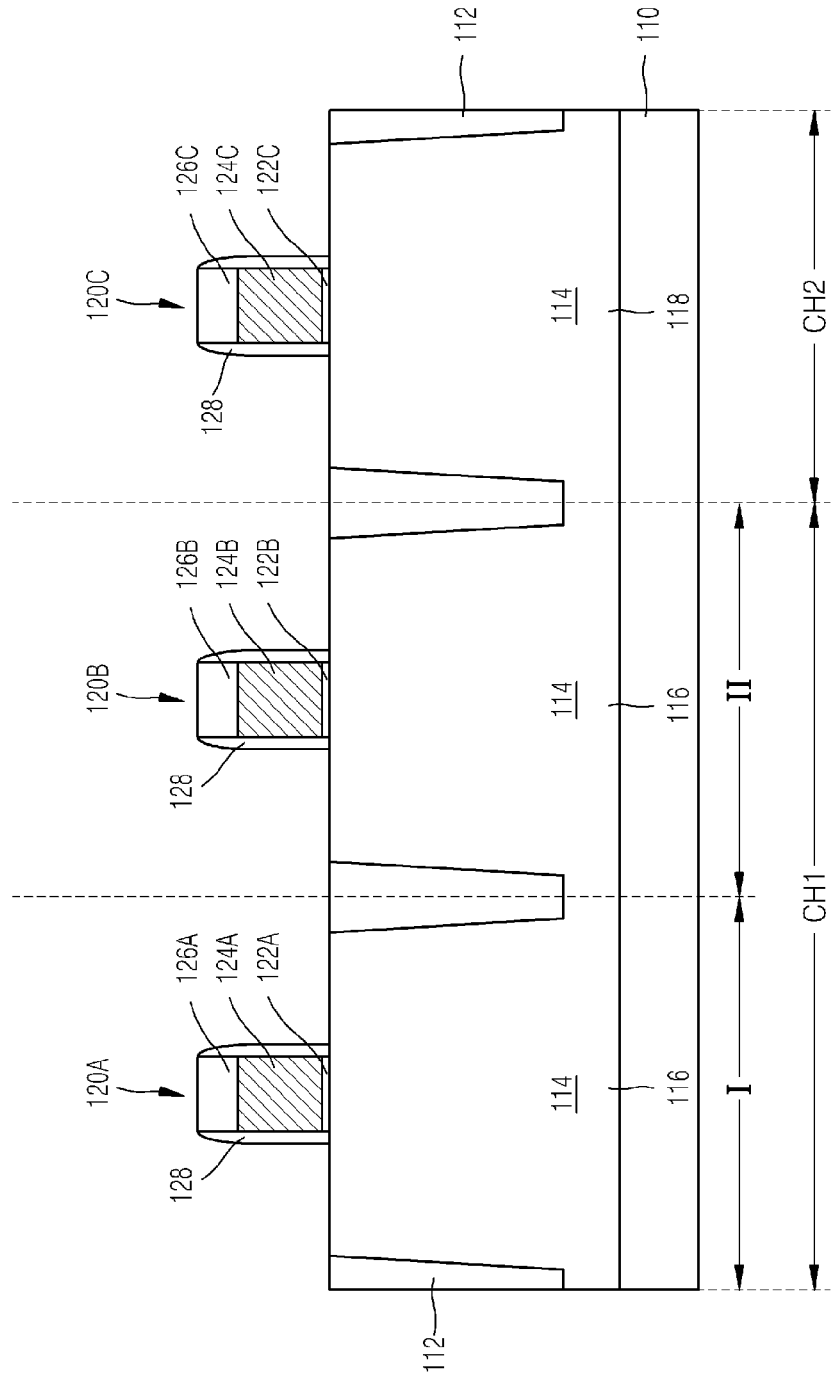

Referring to FIG. 5D, a plurality of first spacers 128 are formed over the sides of each of the first, second, and third gate structures 120A, 120B, and 120C. The first spacers 128 may be formed of silicon oxide.

Referring to FIG. 5E, a first mask pattern 530 is formed on the substrate 110 to cover the second channel type transistor region CH2 while exposing the first channel type transistor region CH1. The first mask pattern 530 may be formed of photoresist.

Then a plurality of first type source/drain extensions 132 are formed in the first channel type transistor region CH1 of the substrate 100, at the surfaces of the active regions 114, by implanting ions (impurities) into the active regions 114 while using the first mask pattern 530, the first and second gate structures 120A and 120B, and the first spacers 128 as (ion implantation) masks.

When PMOS transistors are formed in the first and second device regions I and II, P-type impurity ions such as boron (B), gallium (Ga), or indium (In), may be implanted into the active regions 114 to form the first type source/drain extensions 132. The boron ions may be implanted in the form of boron fluoride.

Figure 5F:
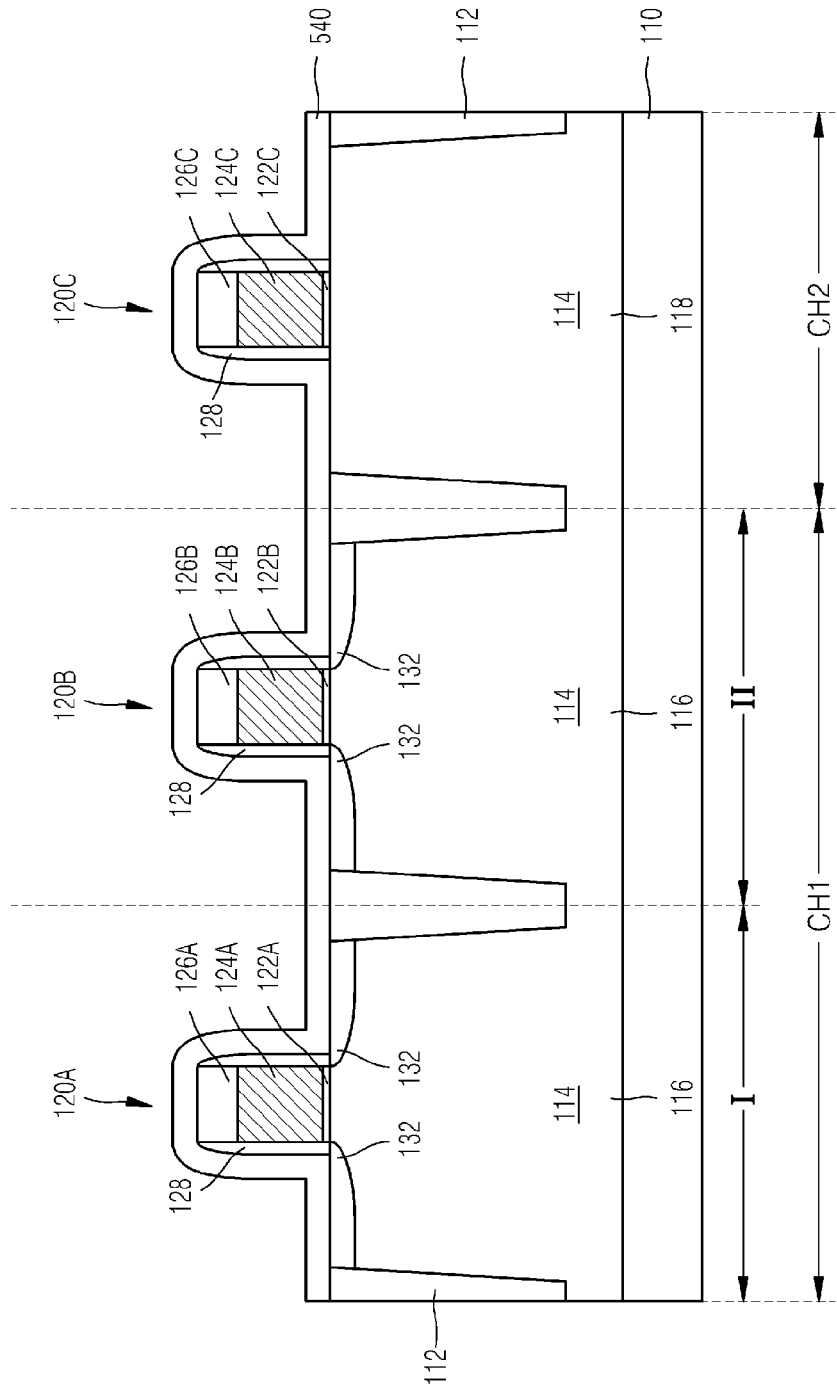

Referring to FIG. 5F, the first mask pattern 530 used as an ion implantation mask in the process of FIG. 5E is removed. Then, a sacrificial insulation layer 540 is formed over structures exposed on the substrate 110.

The sacrificial insulation layer 540 may be formed by plasma enhanced CVD (PECVD), rapid thermal CVD, or CVD using a furnace. In the illustrated embodiment, the sacrificial insulation layer 540 is conformally formed, i.e., is formed so as to conform to the topography or surface profile of the structures exposed on the substrate 110. The sacrificial insulation layer 540 may be formed of a silicon nitride. Also, the sacrificial insulation layer 540 may be formed to a thickness of about 100 to about 300 Å.

Referring to FIG. 5G, a second mask pattern 542 is formed on the sacrificial insulation layer 540 in such a way as to cover the second channel type transistor region CH2 while exposing the first channel type transistor region CH1 of the substrate 110. The second mask pattern 542 may be formed of photoresist.

Referring to FIG. 5H, the sacrificial insulation layer 540 is anisotropically dry-etched using the second mask pattern 542 as an etch mask so as to expose the first type source/drain extensions 132 and the first and second capping layer patterns 126A and 126B formed at the surfaces of the active regions 114, thereby forming a plurality of second spacers 540A that cover side wall surfaces of the first spacers 128.

Figure 5I:
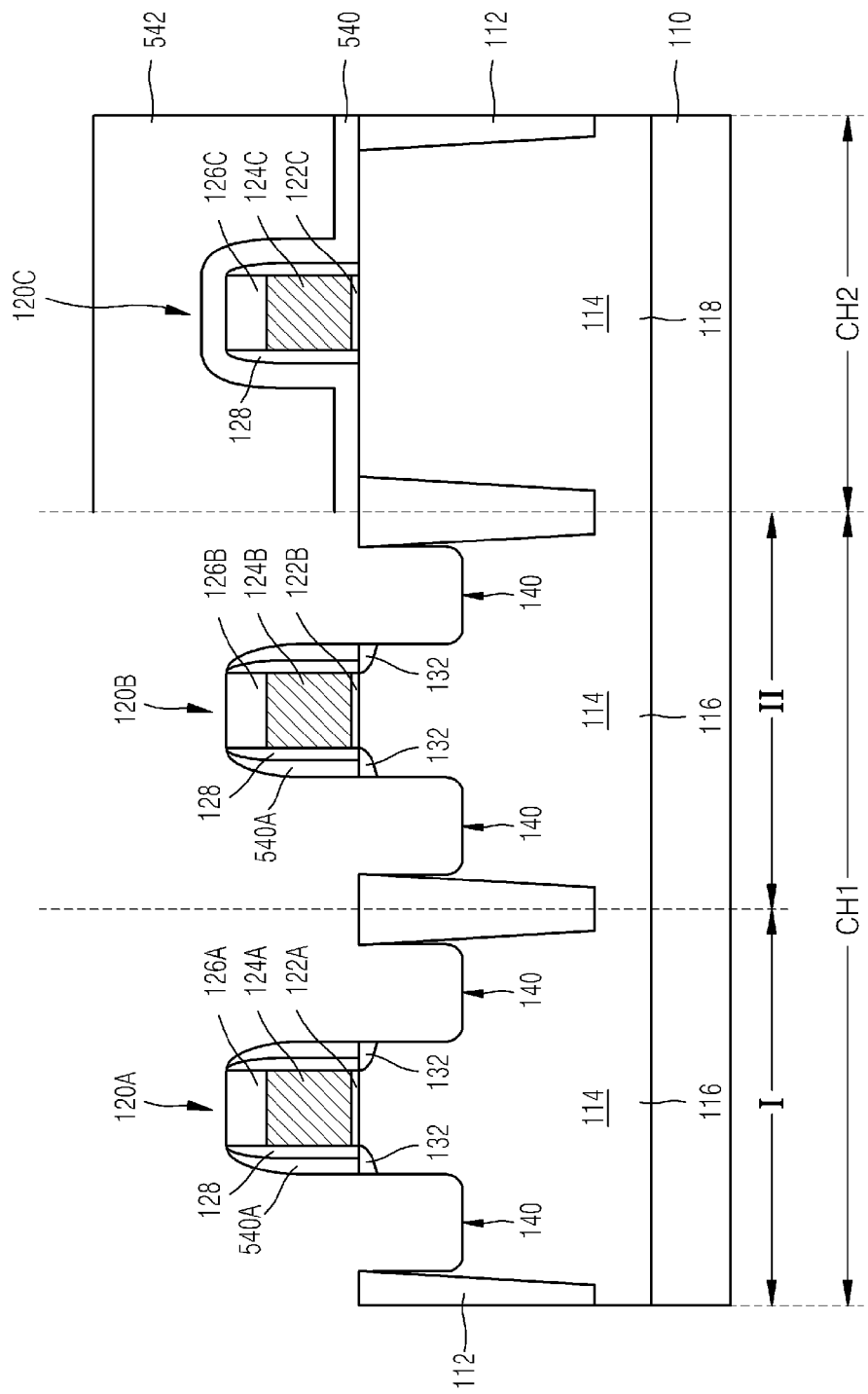

Referring to FIG. 5I, the active regions 114 of the exposed substrate 110 are etched using the second spacers 540A and the first and second capping layer patterns 126A and 126B on the first channel type transistor region CH1 and the second mask pattern 542 on the second channel type transistor region CH2 as etch masks, thereby forming a plurality of recesses 140 in the substrate 110.

The etch process for forming the recesses 140 is carried out under conditions by which the substrate 110 can be selectively etched with high etch selectivity with respect to the second spacers 540A, the first and second capping layer patterns 126A and 126B, the isolation layers 112, and the second mask pattern 542. For example, the substrate 110 may be anisotropically dry etched to form the recesses 140. In this case, the etch process for forming the recesses 140 may be performed right after the etch process for forming the second spacers 540A described above with reference to FIG. 5H, and within the same chamber as that in the which the etch process for forming the second spacers 540A takes place. For example, the exposed substrate 110 may be anisotropically etched using an etch gas including hydrogen chloride (HCl) to form the recesses 140, In the example of this embodiment as shown in FIG. 5I, the recesses 140 have substantially rectangular profiles as a result of an anisotropic etching process. However, the profiles of the recesses 140 may have shapes other than rectangular.

In another example, the recesses are formed using an isotropic etch process. In this case, the recesses will be delimited by surfaces in the family of {111} crystal lattice planes so as to have polygonal profiles.

Figure 5J:
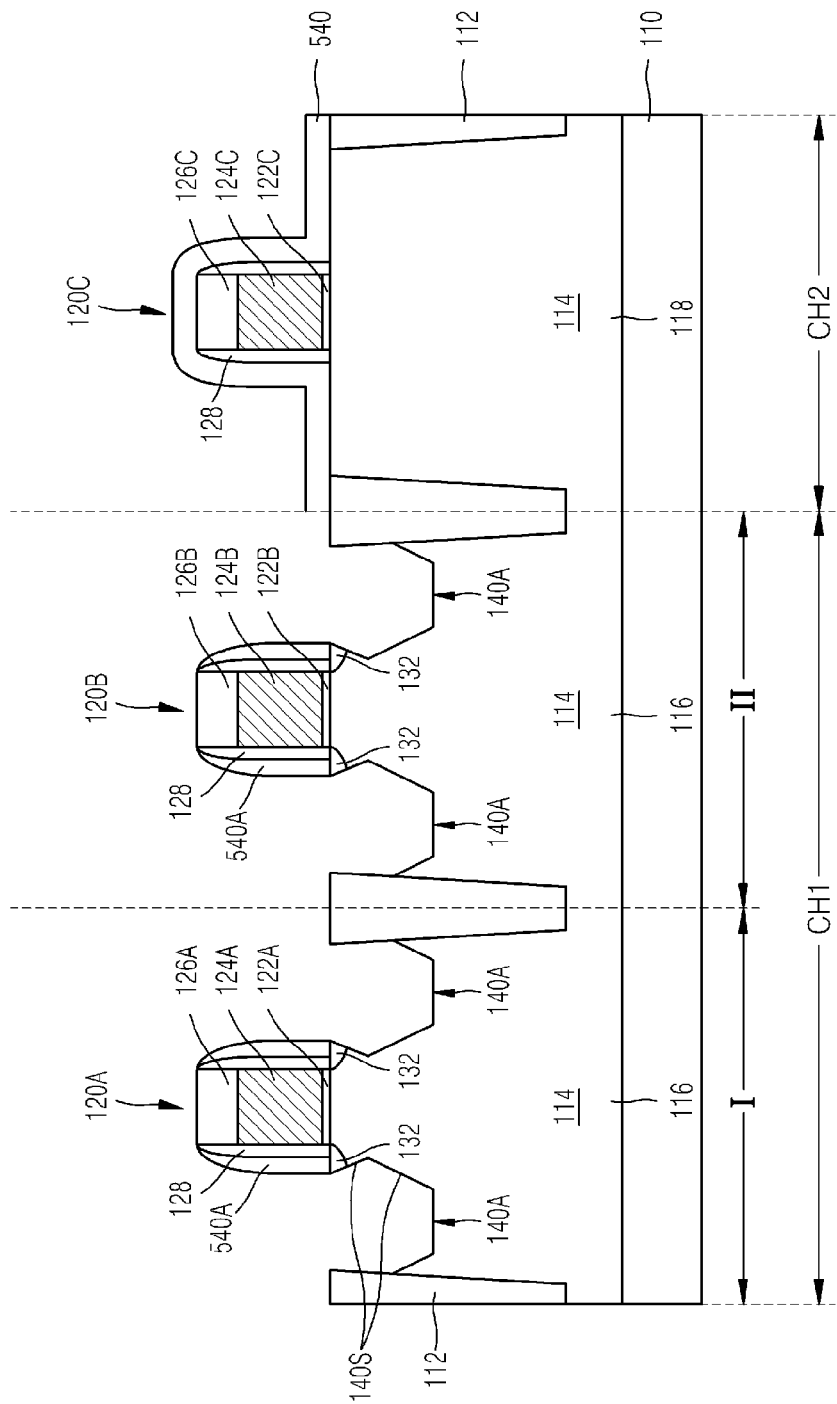

Referring to FIG. 5J, the second mask pattern 542 is removed, leaving the sacrificial insulation layer 540 on the second channel type transistor region CH2. The resultant structure having the recesses 140 is wet-cleaned or wet-etched using a cleaning solution (which process will be referred simply to hereinafter as wet cleaning). The cleaning solution may be an $NH_4OH$ solution, a tetramethyl ammonium hydroxide (TMAH) solution, or a combination thereof. Alternatively, the cleaning solution may be an HF solution or an $NH_4F$ solution.

As a result of the wet cleaning, the profiles and hence, the shapes, of the recesses 140 are changed. In this example, as shown in FIG. 5J, the recesses 140 are altered by the wet cleaning process into recesses 140A having polygonal profiles.

In this respect, the cleaning solution is one that selectively wet etches the substrate 110. In other words, the second spacers 540A, the first and second capping layer patterns 126A and 126B, the isolation layers 112, and the sacrificial insulation layer 540 are not etched (effectively serving as etch masks) while inner surfaces of the substrate 110 that delimit the recesses 140 are etched by the cleaning solution. In the illustrated example of this embodiment, one of the crystal lattice planes of the substrate 110 is used as an etch stop during the cleaning of the substrate 110. For example, a {111} crystal lattice plane of the substrate 110 may be used as an etch stop. In this case, the etch rate of the {111} crystal lattice planes of the substrate 110 is very slow compared to those of the other crystal lattice planes thereof. As a result, the recesses 140A having the aforementioned polygonal profiles are formed. In addition, the wet cleaning process may remove etch byproducts, a natural oxide layer, and the like from surfaces of the structure exposed on the first channel type transistor region CH1 of the substrate 110.

Figure 5K:
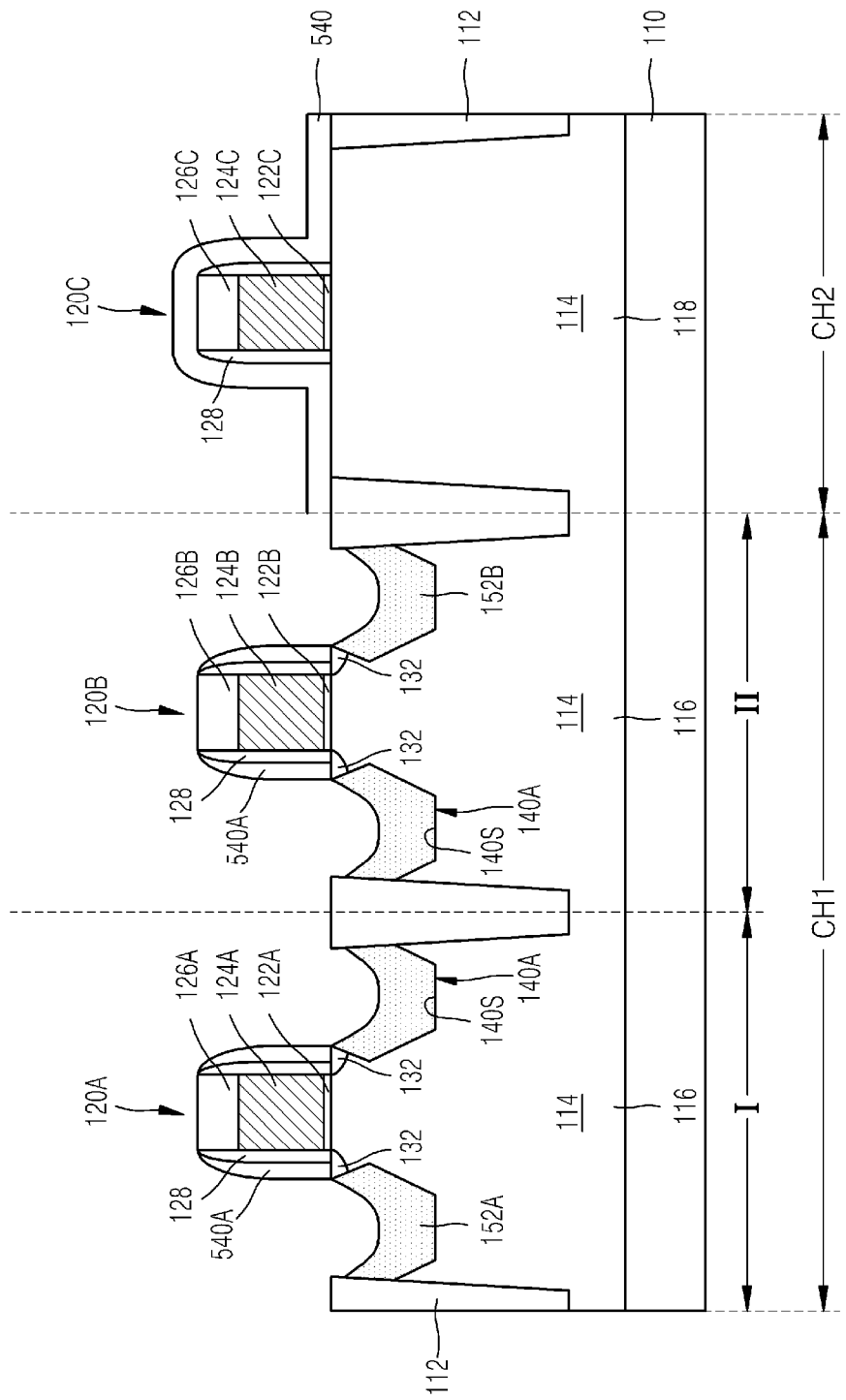

Referring to FIG. 5K, buffer semiconductor layers are formed in the recesses 140A while the sacrificial insulation layer 540 is left on the second channel type transistor region CH2 of the substrate 110. The buffer semiconductor layers formed within the recesses 140A in the first device region I will be referred to as first buffer semiconductor layers 152A, and the buffer semiconductor layers formed within the recesses 140A in the second device region II will be referred to as second buffer semiconductor layers 152B.

The first and second buffer semiconductor layers 152A and 152B fill only portions of the recesses 140A whose bottoms are defined by bottom surfaces 140S. The buffer semiconductor layers 152A and 152B are formed of material whose composition is different from that of the substrate 110. In this embodiment, the substrate 110 is a silicon substrate, and the buffer semiconductor layers 152A and 152B are formed of a SiGe layer having a Ge content of about 10 to about 25 atomic %.

The buffer semiconductor layers 152A and 152B may be formed by a selective epitaxial growth (SEG) process. In an example of this process, the exposed Si surfaces of the substrate 110 delimiting the recesses 140A are exposed to process gas including an Si source gas and a Ge source gas. The Si source gas may comprise at least one of $SiH_4$, $Si(CH_3)_4$, $Si(C_2H_5)_4$, $Si(N(CH_3)_2)_4$, and $SiH_2Cl_2$. The Ge source gas may comprise at least one of $GeH_4$, $Ge(CH_3)_4$, $Ge(C_2H_5)_4$, and $Ge(N(CH_3)_2)_4$. In some cases, the process gas may also include an inert gas such as hydrogen, nitrogen, argon, or helium. Also, the process gas may include a control gas for controlling the selectivity and growth rate of SiGe. The control gas may be HCl.

Preferably, the SEG process is carried out a pressure maintained in a range greater than about 0 Torr and less than or equal to about 200 Torr, and at a process temperature in the range of about 500 to about 700° C.

The buffer semiconductor layers 152A and 152B may also be doped. For example, SiGe layers may be doped in-situ while they are being grown within the recesses 140A by the SEG process. The dopant (impurities) may be B ions. In this case, a B-containing source gas is supplied to the exposed surfaces of the substrate 110 at the same time as the process gas for forming the SiGe. The B-containing source gas may be $B_2H_6$. Alternatively, after the SiGe layers are formed within the recesses 140A by an SEG process, dopant (impurities) may be injected into the SiGe layers by an ion implantation process, and then the structure may be annealed to activate the dopant (impurities).

Figure 5L:
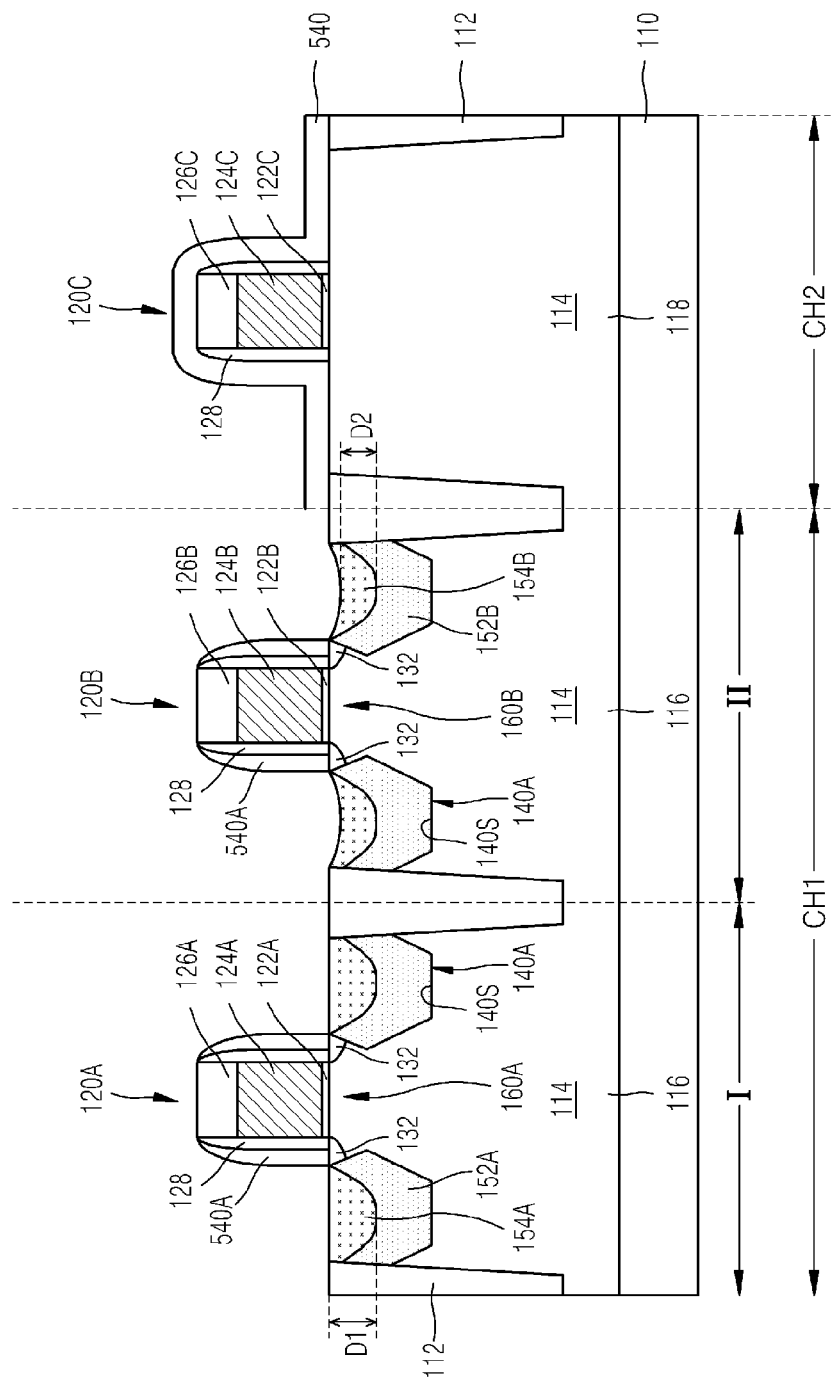

Referring to FIG. 5L, lower main semiconductor layers 154A and 154B are respectively formed on the buffer semiconductor layers 152A and 152B within the recesses 140A by an SEG process while the sacrificial insulation layer 540 remains on the second channel type transistor region CH2 of the substrate. The lower main semiconductor layers 154A which are hence, formed in the first device region I, will be referred to as first lower main semiconductor layers 154A 140A. The lower main semiconductor layers 154B which are in the second device region II will be referred to as second lower main semiconductor layers 154B.

The first and second lower main semiconductor layer 154A and 154B are formed of SiGe layers having Ge contents (atomic %) greater than those of the buffer semiconductor layers 152A and 152B, respectively. Preferably, the first and second lower main semiconductor layers 154A and 154B are formed of a SiGe layer having a Ge content of about 30 to about 50 atomic and, more preferably, a Ge content of about 35 to about 40 atomic %. The first and second lower main semiconductor layers 154A and 154B may also each be doped.

In any case, at this time, the buffer semiconductor layers 152A and 152B prevent defects such as dislocations from occurring due to a sharp difference between the sizes of the crystal lattices of the Si of the substrate 110 and the SiGe of the lower main semiconductor layers 154A and 154B formed in the recesses 140A.

Referring still to FIG. 5L, in the first device region I, the first lower main semiconductor layers 154A fill the recesses 140A from the top surfaces of the first buffer semiconductor layers 152A to the level of the bottom surface of the first gate insulation layer 122A. The thickness or depth D1 of the first lower main semiconductor layers 154A respectively formed at opposite sides of the first gate layer 124A corresponds to that of the first channel region 160A. Also, in this embodiment, none of the top surface of each of the first lower main semiconductor layers 154A extends beneath the level of the bottom surface of the first gate insulation layer 122A.

More specifically, in the illustrated example of this embodiment, the top surfaces of the first lower main semiconductor layers 154A are entirely level with the bottom surface of the first gate insulation layer 122A. Alternatively, at least a part of the top surface of each of the first lower main semiconductor layers 154A may lie at a level above that of the bottom surface of the first gate insulation layer 122A. That is, for example, one part of the top surface of each of the first lower main semiconductor layers 154A may be level with the bottom surface of the first gate insulation layer 122A, while the remaining part thereof is disposed at a level higher than that of the bottom surface of the first gate insulation layer 122A.

In the second device region II, the second lower main semiconductor layers 154B fill the recesses 140A from the top surfaces of the second buffer semiconductor layers 152B to a level equal to or beneath that of the bottom surface of the second gate insulation layer 122B. The thickness or depth D2 of the second lower main semiconductor layers 154B respectively formed at both sides of the second gate layer 124B corresponds to that of the second channel region 160B, and the thickness D2 may be less than the thickness D1 (as shown) or equal to the thickness D1. Also, in this embodiment, none of the top surface of each of the second lower main semiconductor layers 154B is located above the level of the bottom surface of the second gate insulation layer 122B.

More specifically, in the illustrated example of this embodiment, one part of the top surface of each of the second lower main semiconductor layers 154B is level with the bottom surface of the second gate insulation layer 122B, and the remaining part of the top surface of each of the second lower main semiconductor layers 154B lies beneath the level of the bottom surface of the second gate insulation layer 122B. More specifically, the peripheries of the top surfaces of the second lower main semiconductor layers 154B are level with the bottom surface of the second gate insulation layer 122B, and the centers of the top surfaces of the second lower main semiconductor layers 154B are located at a level beneath that of the bottom surface of the second gate insulation layer 122B.

The lower main semiconductor layers 154A and 154B may be formed using a process similar to that described above with reference to FIG. 5K for forming the buffer semiconductor layers 152A and 152B. However, a process pressure of greater than about 0 and less than or equal to about 5 Torr is maintained in the process of forming the lower main semiconductor layers 154A and 154B. The use of this relatively low pressure significantly reduces the possibility of defects, such dislocations, from occurring in the lower main semiconductor layers 154A and 154B.

For example, in the case in which the lower main semiconductor layers 154A and 154B are formed by growing SiGe layers and doping the layers in situ with B ions, the relatively low process pressure of about 5 Torr or less can facilitate the decomposition of the source of B ions, namely, $B_2H_6$, into $BH_3$, as well as the subsequent decomposition of $BH_3$ into B ions. Thus, the lower main semiconductor layers 154A and 154B having a relatively high Ge content can easily be provided with the desired (optimal) concentration of B ions (impurities).

Furthermore, the SiGe grows at a lower rate under lower process pressures. Therefore, the thickness D1 of the first lower main semiconductor layers 154A formed in the first device region I may be greater than the thickness D2 of the second lower main semiconductor layers 154B formed in the second device region II when the lower main semiconductor layers 154A and 154B are formed under the same conditions including the above-mentioned relatively low process pressure of less than or equal to about 5 Torr, in the case in which the exposed area where SiGe can grow is smaller in the first device region I than in the second device region II.

Figure 5M:
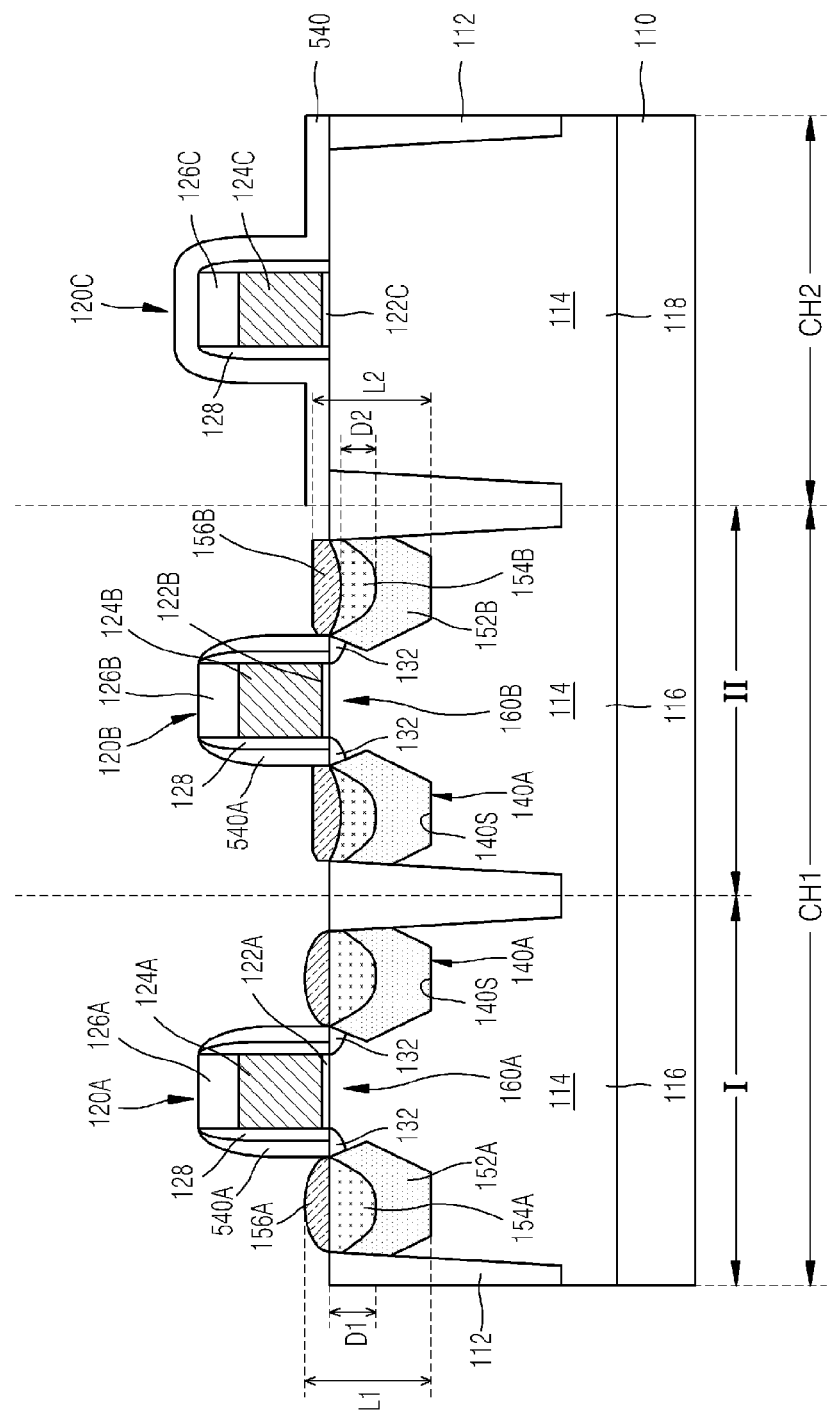

Referring to FIG. 5M, upper main semiconductor layers 156A and 156B are formed on the lower main semiconductor layers by an SEG process while the sacrificial insulation layer 540 is left on the second channel type transistor region CH2. The upper main semiconductor layers formed on the first lower main semiconductor layers 154A in the first device region I will be referred to as first upper main semiconductor layers 156A, and the upper main semiconductor layers formed on the second lower main semiconductor layers 154B in the second device region II will be referred to as second upper main semiconductor layers 156B.

The first and second upper main semiconductor layers 156A and 156B are formed of SiGe having a Ge content (atomic %) less than that of the lower main semiconductor layers 154A and 154B. On the other hand, the Ge content of the upper main semiconductor layers 156A and 156B may be equal to or greater than those of the buffer semiconductor layers 152A and 152B. Preferably, the upper main semiconductor layers 156A and 156B have a Ge content of greater than 0 and less than or equal to about 35 atomic %, and more preferably, a Ge content of about 25 to about 35 atomic %. Also, the upper main semiconductor layers 156A and 156B may be formed of impurity-doped SiGe layers, for example, SiGe layers doped with B ions.

The upper main semiconductor layers 156A and 156B may be formed using a process similar to the process of forming the buffer semiconductor layers 152A and 152B described above with reference to FIG. 5K. However, during the formation of the upper main semiconductor layers 156A and 156B, the process pressure is kept higher than the process pressure during the formation of the lower main semiconductor layers 154A and 154B described above with reference to FIG. 5L. Preferably, the upper main semiconductor layers 156A and 156B are formed by an SEG process in which the process pressure is maintained in a range of from about 10 to about 200 Torr. Thus, the rate at which the SiGe is grown for forming the upper main semiconductor layers 156A and 156B is relatively great.

As the pressure during SEG process increases, the difference between the growth rates of the SiGe layers in the first device region I and the second device region II is reduced. More specifically, in this example, the upper main semiconductor layers 156A and 156B are formed under a relatively high pressure equal to or greater than about 10 Torr. Even though the ratio of the area occupied by the recesses 140A in the first device region I to the overall area of the first device region I is different from the ratio of the area occupied by the recesses 140A in the second device region II to the overall area of the second device region II, the height of the SiGe layers grown in the recesses 140A in the first device region I can be similar to the height of the SiGe layers grown in the recesses 140A in the second device region II.

That is, the difference between the distance L1 from the recess bottom surface 140S to the top surface of the first upper main semiconductor layer 156A and the distance L2 from the recess bottom surface 140S to the top surface of the second upper main semiconductor layer 156B will be less than the same difference if the upper main semiconductor layers 156A and 156B were formed under the relatively low pressure of less than or equal to about 5 Torr.

The upper main semiconductor layers 156A and 156B will not adversely affect the electrical characteristics of transistors including the gate structures 120A and 120B, respectively, even though SiGe grown at the relatively high pressure of about 10 Torr or greater is more likely to produce defects compared to the case in which the SiGe is grown at the relatively low pressure of less than or equal to about 5 Torr. This is because at least portions of the bottom surfaces of the upper main semiconductor layers 156A and 156B closest to the first and second gate insulation layers 122A and 122B are level with or higher than the bottom surfaces of the first and second gate insulation layers 122A and 122B, respectively, and most portions of the upper main semiconductor layers 156A and 156B occupy a level in the device above that of the first and second gate insulation layers 122A and 122B.

Figure 5N:
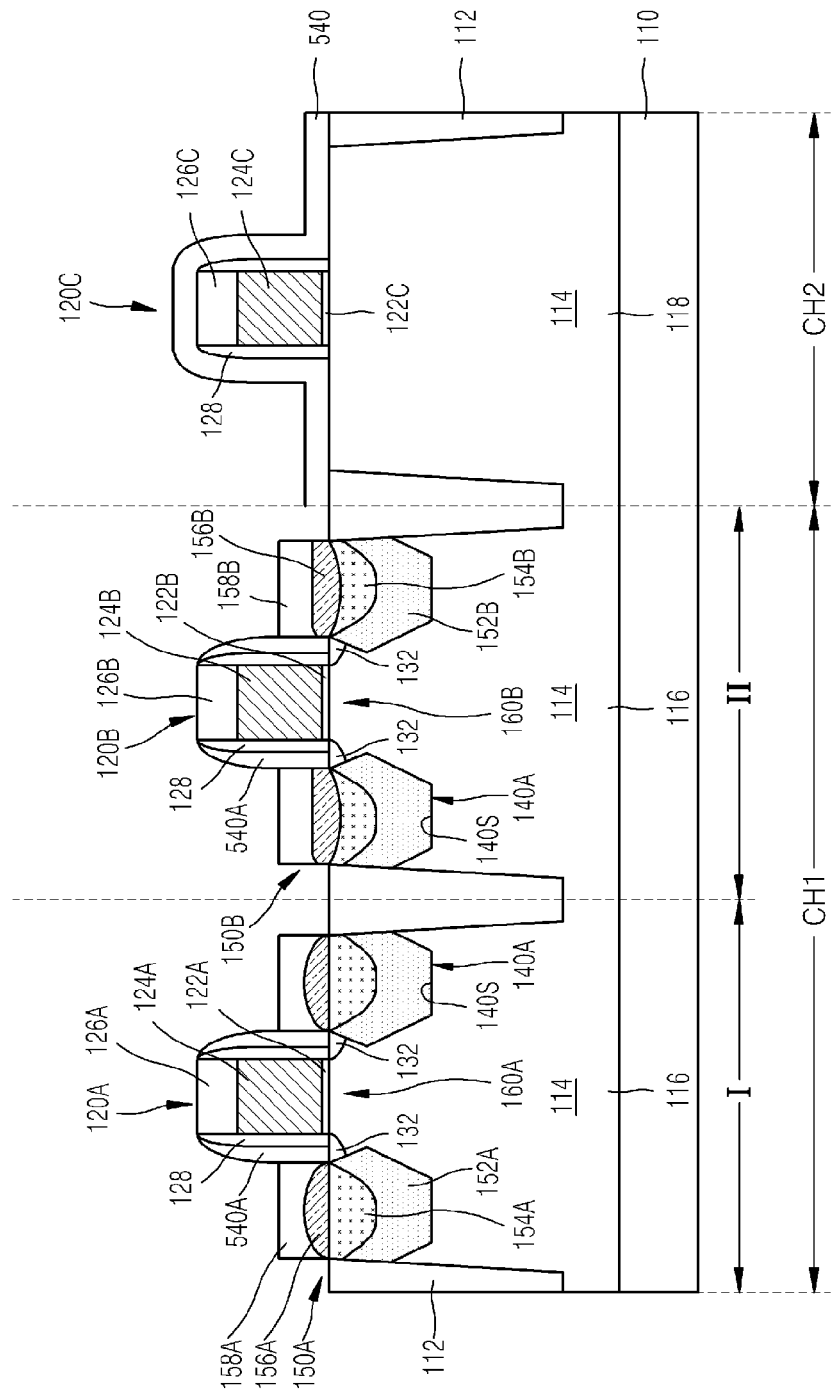
Figure 50:
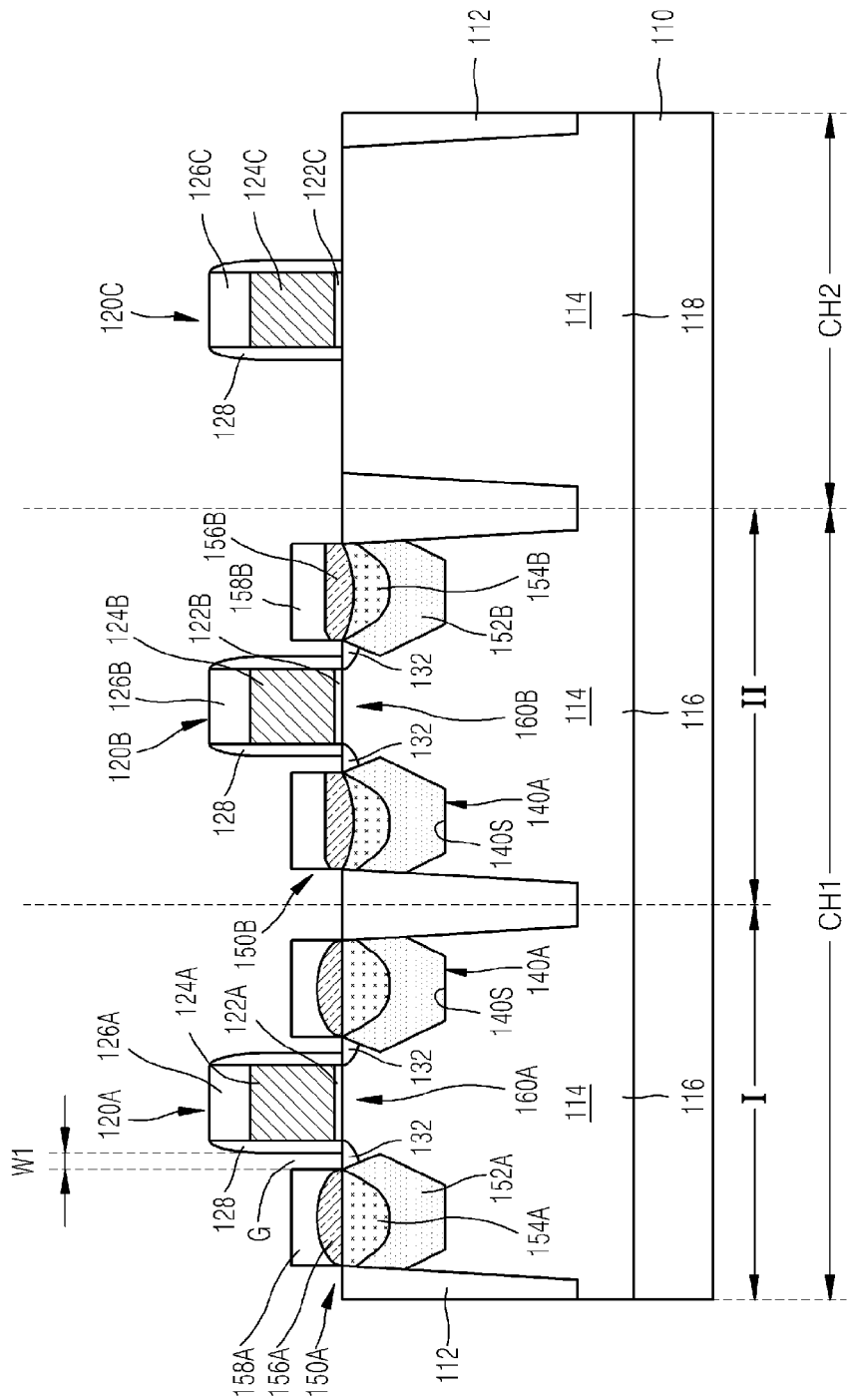

Referring to FIG. 5N, capping semiconductor layers are formed on the upper main semiconductor layers 156A and 156B by an SEG process while the sacrificial insulation layer 540 is left on the second channel type transistor region CH2. The capping semiconductor layers 158A formed on the first upper main semiconductor layers 156A in the first device region I will be referred to as first capping semiconductor layers 158A, and the capping semiconductor layers formed on the second upper main semiconductor layers 156B in the second device region II will be referred to as second capping semiconductor layers 158B. The capping semiconductor layers 158A and 158B may be formed using a process similar to the formation process of the buffer semiconductor layers 152A and 152B described above with reference to FIG. 5K.

The Ge content (atomic %) of the capping semiconductor layers 158A and 158B may be less than or equal to that of the upper main semiconductor layers 156A and 156B. In some cases, the capping semiconductor layers 158A and 158B are formed of a SiGe layer having a Ge content less than or equal to about 10 atomic %. In other cases, the capping semiconductor layers 158A and 158B have no Ge content In other words, the capping semiconductor layers 158A and 158B may be formed of Si. Furthermore, the capping semiconductor layers 158A and 158B may be formed of an impurity-doped Si or SiGe layer, for example, an Si or SiGe layer doped with B ions.

Referring to FIG. 5O, the second spacers 540A (refer back to FIG. 5N) remaining in the first and second device regions I and II and the sacrificial insulation layer 540 remaining on the second channel type transistor region CH2 are removed to expose the first spacers 128 covering the sidewalls of each of the first, second, and third gate structures 120A, 120B, and 120C on the first and second channel type transistor regions CH1 and CH2. In this respect, the second spacers 540A and the sacrificial insulation layer 540 may be removed by wet or dry etching.

As a result, a gap G having a width W1 exists between the first spacers 128 and the capping semiconductor layers 158A and 158B in the transistor structures on the first channel type transistor region CH1.

Figure 5P:
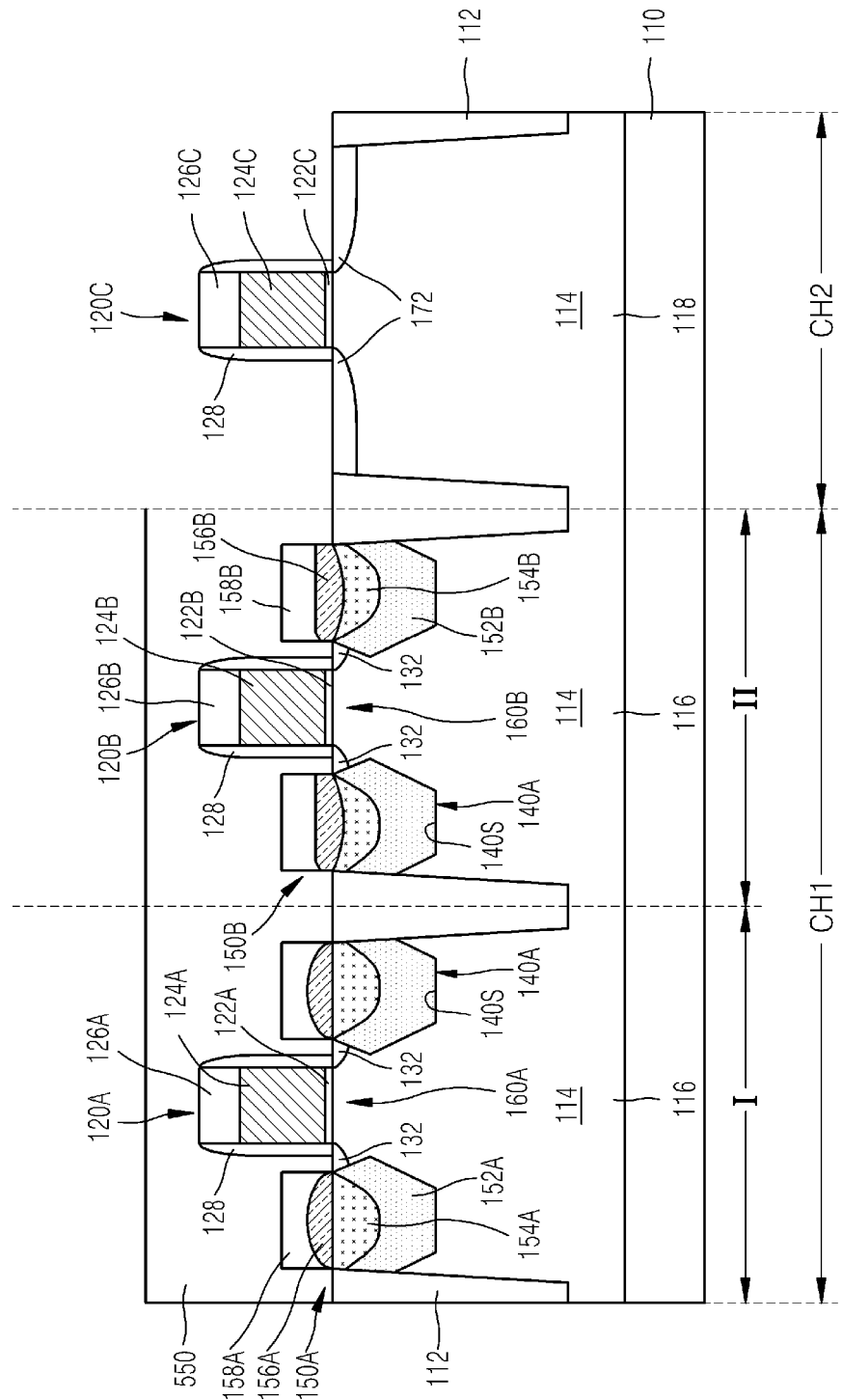

Referring to FIG. 5P, next, a third mask pattern 550 is formed on the substrate 110 to cover the structures on the first channel type transistor region CH1 while leaving the structures on the second channel type transistor region CH2 exposed. The third mask pattern 550 may be formed of photoresist. Then second type source and drain extensions 172 are formed at the surface of the active region 114 of the second channel type transistor region CH2 by implanting impurity ions into the substrate 110 using the third mask pattern 550, the third gate structure 120C, and the first spacers 128 as ion implantation masks. For example, when NMOS transistors are to be provided at the second channel type transistor region CH2, N-type impurity ions such as phosphorous (P), arsenic (As), or antimony (Sb), may be implanted into the active region 114 to form the second type source and drain extensions 172.

Referring to FIG. 5Q, the third mask pattern is removed. Then, third spacers 174 are formed over the exposed sidewalls of the first spacers 128. More specifically, an insulation layer (not shown) is conformally formed over the structure shown in FIG. 5P and then is anisotropically dry-etched to form the third spacers 174. The third spacers 174 may be formed of silicon oxide.

Also, the width W2 of each of the third spacers 174 may be equal to or greater than the width W1 of the gap G formed between the first spacers 128 and the capping layer when the second spacers are removed (FIG. 5O).

Figure 5R:
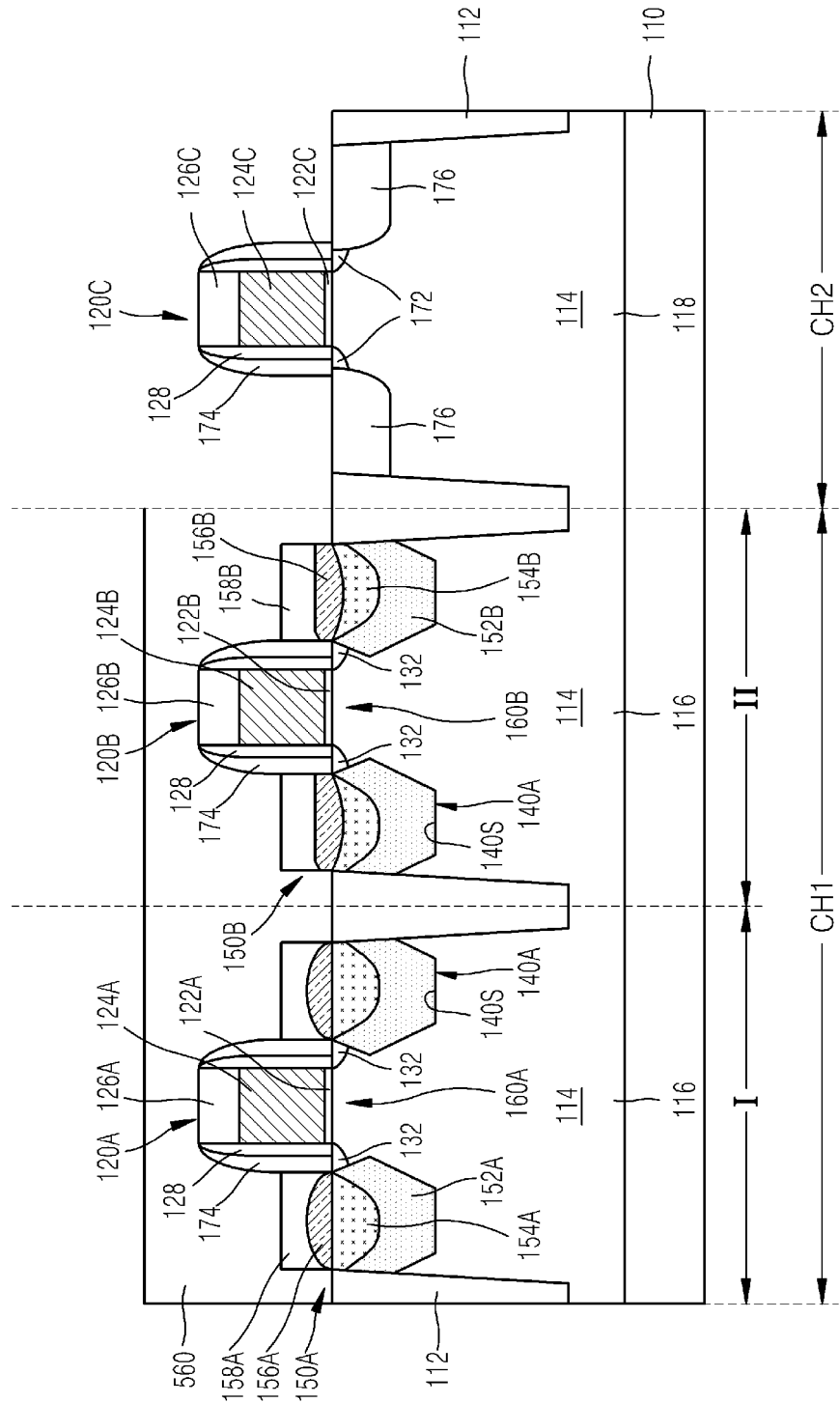

Referring to FIG. 5R, a fourth mask pattern 560 is then formed on the substrate 110 to cover the first channel type transistor region CH1 and the second channel type transistor region CH2. The fourth mask pattern 560 may be formed of photoresist. Next, third source and drain regions 176 are formed at the surface of the active region 114 of the second channel type transistor region CH2 by implanting impurity ions into the substrate 110 using the fourth mask pattern 560, the third gate structure 120C, the first spacers 128, and the third spacers 174 as ion implantation masks. For example, N-type impurity ions such as P, As, or Sb may be implanted into the active region 114 to form the third source and drain regions 176 when NMOS transistors are to be formed at the upper portion of the second channel type transistor region CH2.

Figure 5S:
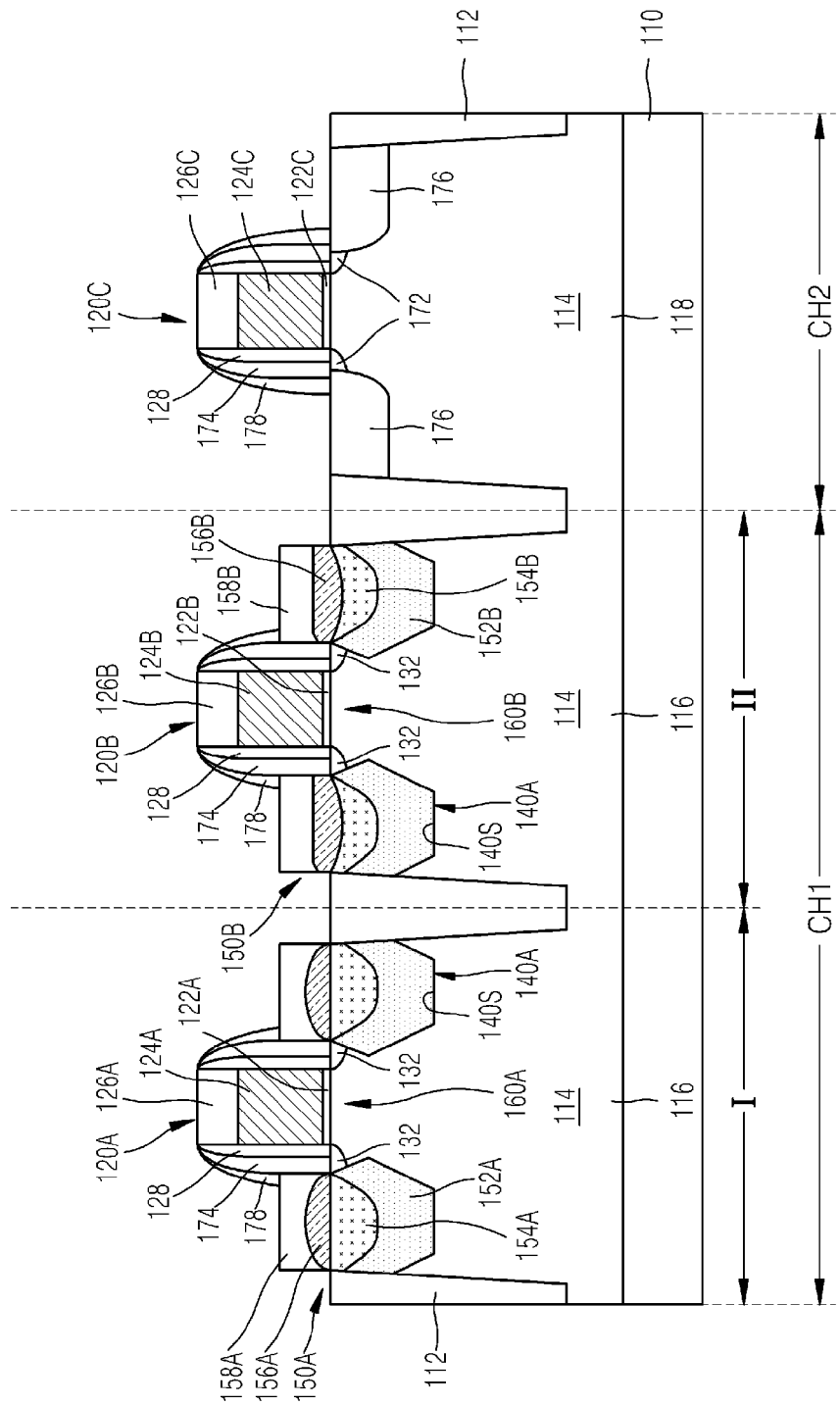

Referring to FIG. 5S, subsequently, the fourth mask pattern 560 is removed. Then fourth spacers 178 are formed over the exposed sidewalls of the third spacers 128 on the first channel type transistor region CH1 and the second channel type transistor region CH2. More specifically, an insulation layer (not shown) is conformally formed over the structure shown FIG. 5R. Then the insulation layer is anisotropically dry-etched. The insulation layer and hence, the fourth spacers 178, may be formed of silicon oxide.

Figure 5T:
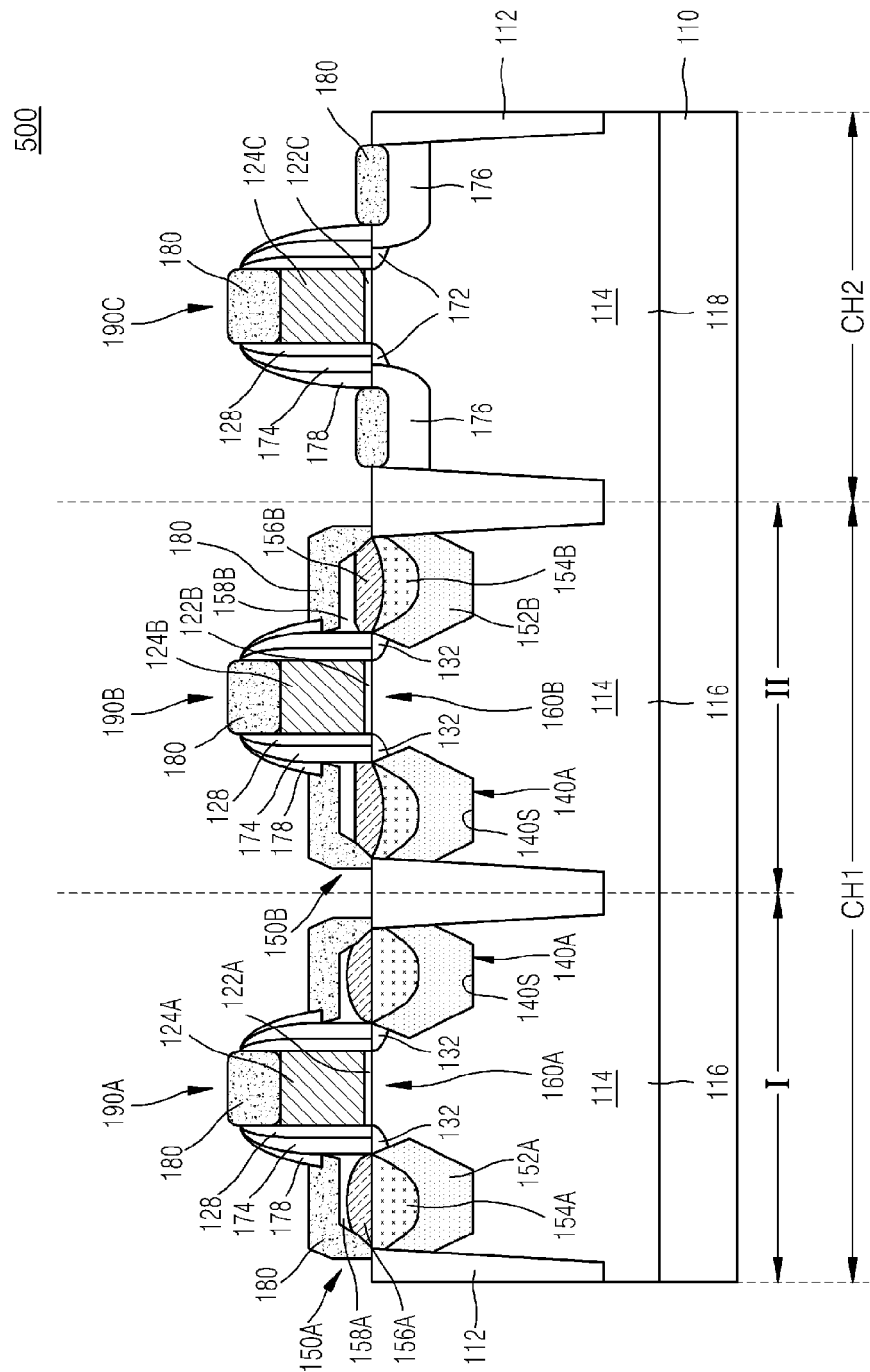

Referring to FIG. 5T, the first, second, and third capping layer patterns 126A, 126B, and 126C are then removed to expose top surfaces of the first, second, and third gate layers 124A, 124B, and 124C on the first channel type transistor region CH1 and the second channel type transistor region CH2. Subsequently, metal silicide layers 180 are formed on exposed surfaces of the capping semiconductor layers 158A and 158B of the first and second source/drain regions 150A and 150B, exposed surfaces of the third source and drain regions 176, and exposed surfaces of the first, second, and third gate layers 124A, 124B, and 124C. The metal silicide layers 180 may be formed of cobalt silicide, titanium silicide, tantalum silicide, tungsten silicide, or aluminum silicide.

Consequently, a first transistor 190A and a second transistor 190B are formed at the top of the first channel type transistor region CH1 of the substrate 110, and a third transistor 190C is formed at the top of the second channel type transistor region CH2.

As described above, in the forming of embedded source/drain regions in regions (recesses) having different surface areas, respectively, SiGe is grown under a relatively low pressure to form the first and second lower main semiconductor layers 154A and 154B. This allows the embedded source/drain regions to be formed with desired electrical characteristics and hence, allows desired electrical characteristics to be imparted to each transistor constituted by the embedded source/drain regions. Subsequently, SiGe is grown under a relatively high pressure to form the first and second upper main semiconductor layers 156A and 156B on the first and second lower main semiconductor layers 154A and 154B, thereby compensating for the difference between the SiGe growth rates in the regions (recesses) having different surface areas. Accordingly, a difference between the heights of the embedded source/drain regions of SiGe can be minimized. Consequently, an etch stop point in a subsequent process of forming contact holes, for containing contacts to be electrically connected to the source/drain regions, can be determined relatively easily. Hence, a high product yield may be attained.

Figure 6:
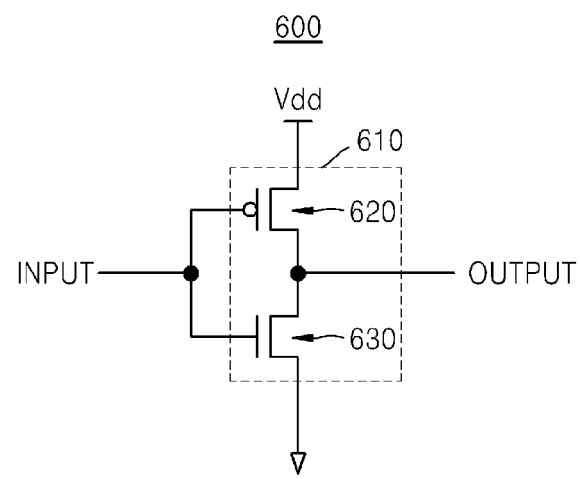
FIG. 6 is a circuit diagram of a CMOS inverter according to the inventive concept.

A CMOS inverter 600, as an example of a semiconductor device according to the inventive concept, will now be described with reference to the circuit diagram of FIG. 6.

The CMOS inverter 600 comprises a CMOS device 610 including a PMOS transistor 620 and an NMOS transistor 630 connected between a power supply terminal Vdd and a ground terminal. At least one of the transistors 620 and 630 is of a type described above with reference to FIGS. 1 and 2.

Figure 7:
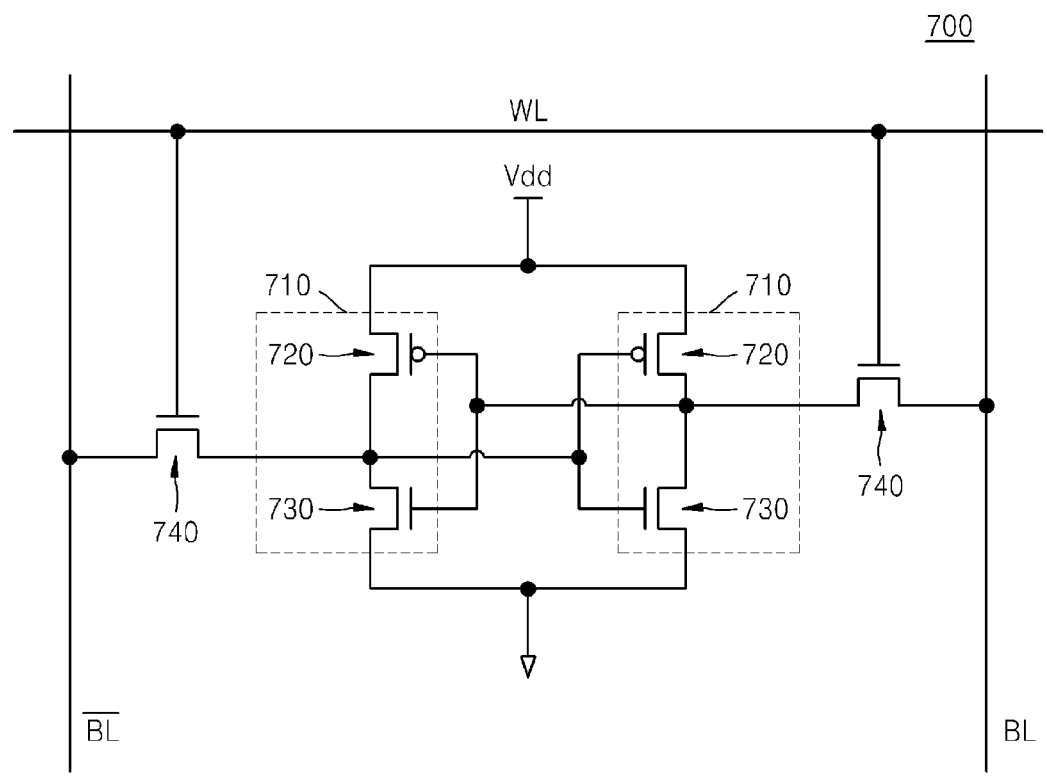
FIG. 7 is a circuit diagram of a CMOS SRAM according to the inventive concept.

A CMOS SRAM 700 as another example of a semiconductor device according to the inventive concept is shown in FIG. 7.

The CMOS SRAM 700 includes a pair of CMOS devices 710 each including a PMOS transistor 720 and an NMOS transistor 730 connected between a power supply terminal Vdd and a ground terminal. The CMOS SRAM 700 further includes a pair of transmission transistors 740. Sources of the transmission transistors 740 are cross-connected to common nodes of the PMOS transistors 720 and the NMOS transistors 730. A power supply terminal Vdd is connected to sources of the PMOS transistors 720, and a ground terminal is connected to sources of the NMOS transistors 730. A word line WL is connected to gates of the transmission transistors 740, and a bit line BL and an inverted bit line $\overline{BL}$ are connected to drains of the transmission transistors 740, respectively.

At least one of the transistors of the CMOS devices 710 and the transmission transistor 740 of the CMOS SRAM 700 is of a type described above with reference to FIGS. 1 and 2.

Figure 8:
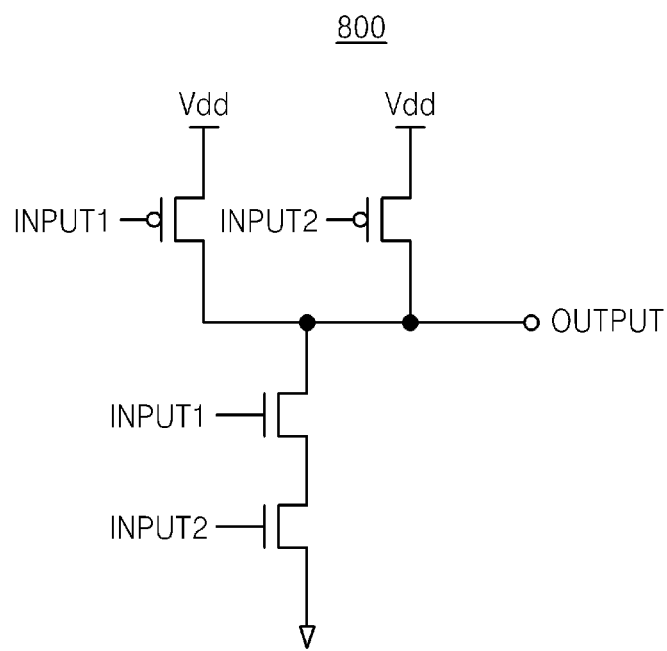
FIG. 8 is a circuit diagram of a CMOS NAND circuit according to the inventive concept.

A CMOS NAND circuit 800 as another example of a semiconductor device according to the inventive concept will be described with respect to the circuit diagram of FIG. 8.

The CMOS NAND circuit 800 includes a pair of CMOS devices to which different input signals are transmitted. At least one of the two CMOS devices comprises transistors of a type described above with reference to FIGS. 1 and 2.

Figure 9:
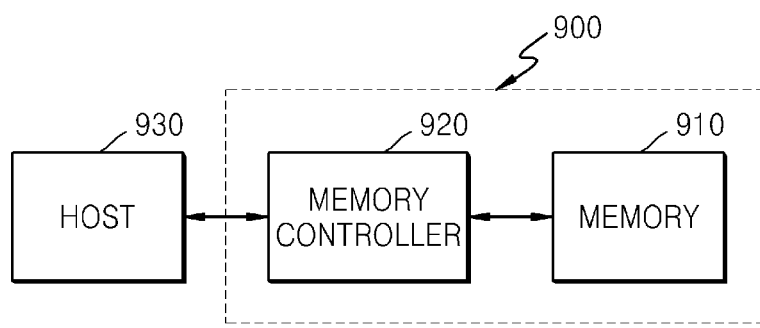
FIG. 9 is a block diagram of one example of an electronic system employing a semiconductor device according to the inventive concept.

FIG. 9 is a block diagram of an electronic system 900 which employs a semiconductor device according to the inventive concept.

The electronic system 900 includes a memory 910 and a memory controller 920. Data is read out from and/or written to the memory 910 in response to a request of a host 930 under the control of the memory controller 920. At least one of the memory 910 and the memory controller 920 includes at least one transistor of the type described above with reference to FIGS. 1-5T.

Figure 10:
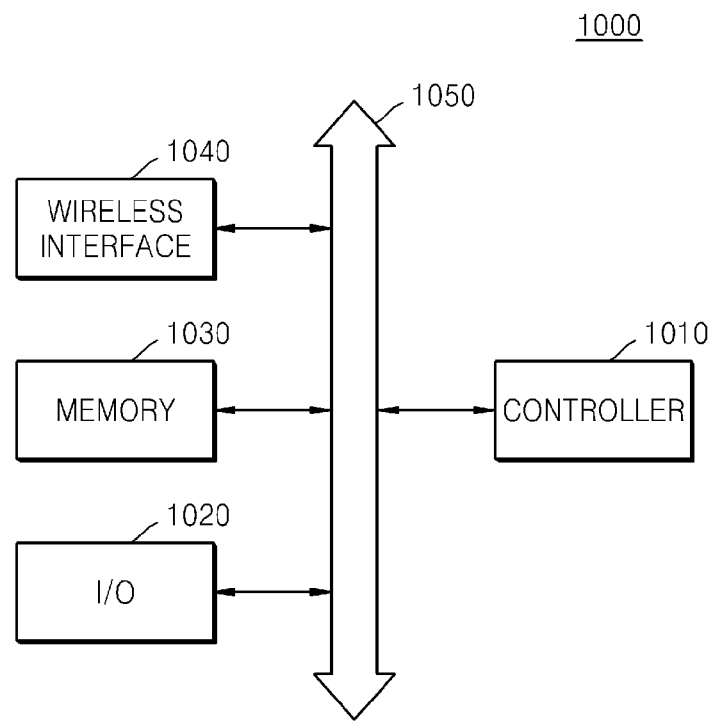
FIG. 10 is a block diagram of another example of an electronic system employing a semiconductor device according to the inventive concept.

FIG. 10 is a block diagram of an electronic system 1000 which employs a semiconductor device according to the inventive concept. The electronic system 1000 constitutes a wireless device.

Referring to FIG. 10, the electronic system 1000 includes a controller 1010, an input/output (I/O) device 1020, a memory 1030, and a wireless interface 1040, which are connected to one another via a bus 1050.

The controller 1010 may include at least one of a microprocessor, a digital signal processor, and the like. The I/O device 1020 may include at least one of a keypad, a keyboard, and a display. The memory 1030 may store commands executed by the controller 1010. For example, the memory 1030 may store user data. The electronic system 1000 may use the wireless interface 1040 to transmit/receive data via a wireless communications network. The wireless interface 1040 may include an antenna and/or a wireless transceiver. Also, the electronic system 1000 may constitute a third-generation communications system operable under a code division multiple access (CDMA), global system for mobile communications (GSM), north American digital cellular (NADC), extended-time division multiple access (E-TDMA), and/or wide band code division multiple access (WCDMA) protocol, for example. The electronic system 1000 includes at least one of transistor of a type described above with reference to FIGS. 1 and 2.

Figure 11:
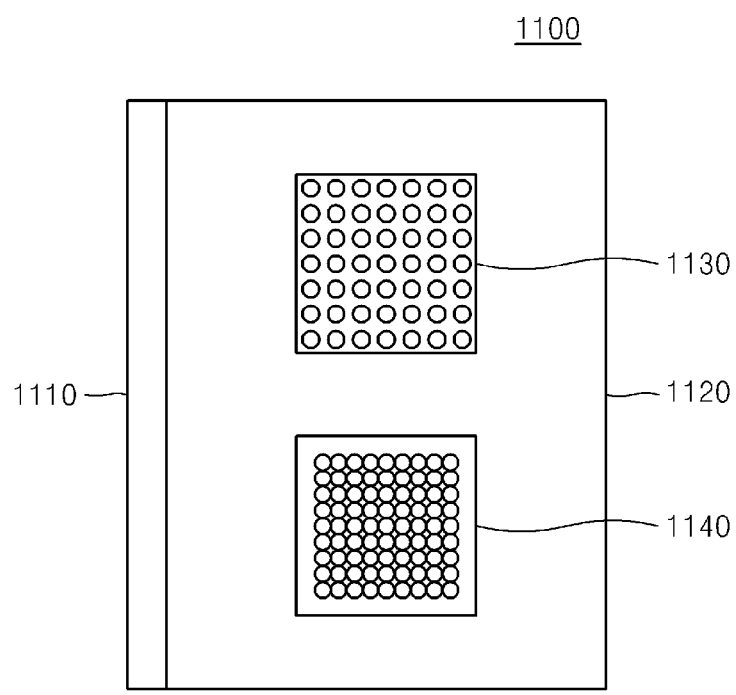
FIG. 11 is a plan view of an electronic subsystem employing a semiconductor device according to the inventive concept.

An example of an electronic subsystem 1100 employing a semiconductor device according to the inventive concept is shown in FIG. 11.

The electronic subsystem 1100 is a modular memory including an electrical connector 1110 and a printed circuit board 1120. The printed circuit board 1120 supports a memory unit 1130 and a device interface unit 1140. The memory unit 1130 may have various types of data storage structures. The device interface unit 1140 is electrically connected to each of the memory unit 130 and the electrical connector 1110 via the printed circuit board 1120. The device interface unit 1140 may include components for generating a voltage, a clock frequency, and a protocol logic. The electronic subsystem 1100 includes at least one transistor of a type described above with reference to FIGS. 1 and 2.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device comprising:
   a substrate having a channel region, and a pair of recesses therein on both sides of the channel region;
   a gate insulation layer on the channel region;
   a gate electrode on the gate insulation layer; and
   a source region and a drain region on surfaces delimiting bottoms of the recesses, respectively, at least one of the source and drain regions including:
   a lower main layer of material comprising Ge and having a bottommost point disposed at a level in the device higher than that of the bottoms of the recesses and lower than that of the bottom surface of the gate insulation layer, and a top surface no portion of which is disposed above the level of the bottom surface of the gate insulation layer, and
   an upper main layer contacting the lower main layer, and having a topmost point disposed at a level in the device higher than that of the bottom surface of the gate insulation layer, and
   wherein the Ge content in terms of atomic % of the lower main layer is greater than that of the upper main layer; and
   a buffer layer disposed in the recesses and interposed entirely between the lower main layer and the substrate, and
   wherein none of the lower main layer contacts the substrate, and the Ge content of the lower main layer is greater than that of the buffer layer.

2. The semiconductor device of claim 1, wherein the Ge content of the lower main layer is about 30 to about 50 atomic %, and the upper main layer is of material comprising Ge.

3. The semiconductor device of claim 1, wherein the Ge content of the lower main layer is about 30 to about 50 atomic %, the buffer layer is of material comprising Ge, and the Ge content of the buffer layer is about 10 to about 25 atomic %.

4. The semiconductor device of claim 1, further comprising a capping layer on the upper main layer, and wherein the Ge content of the upper main layer is greater than that of the capping layer.

5. The semiconductor device of claim 1, further comprising a metal silicide layer on the upper main layer.

6. The semiconductor device of claim 1, wherein the lower main layer and the upper main layer are each of impurity-doped SiGe.

7. A semiconductor device having a first device region and a second device region, comprising:
   a substrate having a plurality of recesses therein in each of the first device region and the second device region of the device;
   a first transistor in the first device region and comprising a first gate insulation layer, a first gate electrode, and first source and drain regions; and a second transistor in the second device region and comprising a second gate insulation layer, a second gate electrode, and second source and drain regions, wherein the first source and drain regions comprise:

a first lower main layer of material comprising Ge and having a bottommost point disposed at a level in the device higher than the bottoms of the recesses in the first device region and lower than that of the bottom surface of the first gate insulation layer, and a top surface no portion of which is disposed above the level of the bottom surface of the first gate insulation layer, and a first upper main layer disposed on the first lower main layer, and having a topmost point disposed at a level in the device higher than that of the bottom surface of the first gate insulation layer, and wherein no portion of the top surface of the first lower main layer that faces the upper main layer is disposed above the level of the bottom surface of the first gate insulation layer, and the Ge content in terms of atomic % of the first lower main layer is greater than that of the first upper main layer, and wherein the second source and drain regions comprise:

a second lower main layer of material comprising Ge and having a bottommost point disposed at a level in the device higher than the bottoms of the recesses in the second device region and lower than that of the bottom surface of the second gate insulation layer, and a top surface, and a second upper main layer disposed on the second lower main layer, and having a topmost point disposed at a level in the device higher than that of the bottom surface of the second gate insulation layer, and a bottom surface that faces the second lower main layer, and wherein at least a portion of the top surface of the second lower main layer that faces the second upper main layer and at least of portion of the bottom surface of the second upper main layer are each disposed below the level of the bottom surface of the second gate insulation layer, and the Ge content in terms of atomic % of the second lower main layer is greater than that of the second upper main layer.

8. The semiconductor device of claim 7, wherein the first and second transistors have the same channel type as each other.

9. The semiconductor device of claim 7, wherein the first device region has a first area proportion, which is the ratio of the sum of the areas occupied by all of the source and drain regions at an upper surface of the substrate in the first device region to the overall area of the first device region, the second device region has a second area proportion, which is the ratio of the sum of the areas occupied by all source and drain regions at an upper surface of the substrate in the second device region to the overall surface area of the second device region, and the first and second area proportions have different values.

10. The semiconductor device of claim 9, wherein the first area proportion is less than the second area proportion.

11. The semiconductor device of claim 7, wherein the first device region has a first transistor density corresponding to the number of transistors per unit area in the first device region, the second device region has a second transistor density corresponding to the number of transistors in the second device region per said unit area in the second device region, and the first and second transistor densities have different values.

12. The semiconductor device of claim 11, wherein the first transistor density is smaller than the second transistor density.

13. The semiconductor device of claim 7, wherein the Ge content of the first lower main layer and the Ge content of the second lower main layer are each within a range of about 30 to about 50 atomic %, the first upper main layer is of material comprising Ge and has a Ge content less than the Ge content of the first lower main layer, and the second upper main layer is of material comprising Ge and has a Ge content less than the Ge content of the second lower main layer.

14. The semiconductor device of claim 7, wherein the first source and drain regions further comprise a first buffer layer interposed between bottom surfaces of the substrate, which delimit the bottoms of the recesses in the first device region, and the first lower main layer and wherein the Ge content of the first lower main layer is greater than that of the first buffer layer, and the second source and drain regions further comprise a second first buffer layer interposed between bottom surfaces of the substrate, which delimit the bottoms of the recesses in the second device region, and the second lower main layer and wherein the Ge content of the second lower main layer is greater than that of the second buffer layer.

15. The semiconductor device of claim 7, wherein one part of the top surface of the second lower main layer of material comprising Ge is disposed at the same level as the bottom surface of the second gate insulation layer, and a remaining part of the second lower main layer dips from said one part below the level of the bottom surface of the second gate insulation layer.

16. A semiconductor device having a first device region and a second device region, comprising:

a substrate having a plurality of recesses in the first device region and a plurality of recesses in the second device region, whereby the recesses have openings at an upper surface of the substrate, and wherein the layout of the openings in the first device region is different from the layout of the openings in the second device region;

a first transistor in the first device region and a second transistor in the second device region, and the transistors being constituted by an insulating layer providing gate insulation layers of the transistors, a conductive layer providing gate electrodes of the transistors, and embedded source and drain regions occupying respective ones of the recesses and providing sources and drains of the transistors, and wherein the embedded source and drain regions of the first transistor occupy respective ones of the recesses in the first device region, the embedded source and drain regions of the second transistor occupy respective ones of the recesses in the second device region, and the embedded source and drain regions of the first and second transistors are each of material comprising Ge, and the Ge content of the material in terms of atomic % decreases in a direction from a first point disposed at a level in the device lower than that of the bottom surface of the insulating layer to a topmost point disposed at a level in the device higher than that of the bottom surface of the insulating layer.

17. The semiconductor device of claim 16, wherein the Ge content of the source and drain regions is about 30 to about 50 atomic % throughout a portion thereof from the first point to a second point that is no higher than the bottom surface of the insulating layer, and is greater than 0 atomic % throughout a portion thereof between the second point and the topmost point thereof.

18. The semiconductor device of claim 17, wherein the Ge content of the material of the embedded source and drain regions is greater in a portion thereof between the first and second points than in a portion thereof between the first point and the bottoms of the recesses.

19. The semiconductor device of claim 18, wherein the Ge content of the material of the embedded source and drain regions is about 10 to about 25 atomic % throughout the portion thereof between the first point and the bottoms of the recesses.

20. The semiconductor device of claim 16, wherein the material is SiGe doped with boron ions.

* * * * *